US009818857B2

(12) United States Patent
Klowak et al.

(10) Patent No.: US 9,818,857 B2
(45) Date of Patent: *Nov. 14, 2017

(54) FAULT TOLERANT DESIGN FOR LARGE AREA NITRIDE SEMICONDUCTOR DEVICES

(71) Applicant: GaN Systems Inc., Ottawa (CA)

(72) Inventors: Greg P. Klowak, Ottawa (CA); Cameron McKnight-Macneil, Nepean (CA); Howard Tweddle, Carp (CA); Ahmad Mizan, Kanata (CA); Nigel Springett, Emmendingen (DE)

(73) Assignee: GaN Systems Inc., Ottawa, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/032,824

(22) PCT Filed: Oct. 28, 2014

(86) PCT No.: PCT/CA2014/000762
§ 371 (c)(1),
(2) Date: Apr. 28, 2016

(87) PCT Pub. No.: WO2015/061881
PCT Pub. Date: May 7, 2015

(65) Prior Publication Data
US 2016/0284829 A1  Sep. 29, 2016

Related U.S. Application Data

(60) Provisional application No. 61/896,871, filed on Oct. 29, 2013.

(51) Int. Cl.
*H01L 29/20* (2006.01)
*H01L 29/778* (2006.01)
(Continued)

(52) U.S. Cl.
CPC .......... *H01L 29/7787* (2013.01); *H01L 22/14* (2013.01); *H01L 22/22* (2013.01);
(Continued)

(58) Field of Classification Search
CPC ... H01L 22/32; H01L 29/2003; H01L 29/201; H01L 29/205; H01L 29/7787;
(Continued)

(56) References Cited

U.S. PATENT DOCUMENTS 3,783,349 A  1/1974  Beasom
4,152,714 A  5/1979  Hendrickson et al.
(Continued)

FOREIGN PATENT DOCUMENTS

CA  2351368 A1  3/2001
CN  1321123 A  11/2001
(Continued)

OTHER PUBLICATIONS

Karmalkar et al., "Enhancement of Breakdown Voltage in AlGaN/GaN High Electron Mobility Transistors Using a Field Plate", 2001, IEEE Transactions on Electron Devices, vol. 48, No. 8, p. 1515-1521.
(Continued)

*Primary Examiner* — Roy Potter
(74) *Attorney, Agent, or Firm* — Miltons IP/p.i.

(57) ABSTRACT

A fault tolerant design for large area nitride semiconductor devices is provided, which facilitates testing and isolation of defective areas. A transistor comprises an array of a plurality of islands, each island comprising an active region, source and drain electrodes, and a gate electrode. Electrodes of each island are electrically isolated from electrodes of neighboring islands in at least one direction of the array. Source, drain and gate contact pads are provided to enable electrical testing of each island. After electrical testing of islands to
(Continued)

identify defective islands, overlying electrical connections are formed to interconnect source electrodes in parallel, drain electrodes in parallel, and to interconnect gate electrodes to form a common gate electrode of large gate width Wg. Interconnections are provided selectively to good islands, while electrically isolating defective islands. This approach makes it economically feasible to fabricate large area GaN devices, including hybrid devices.

29 Claims, 12 Drawing Sheets

(51) Int. Cl.

| | | |
|---|---|---|
| H01L 21/66 | (2006.01) | |
| H01L 29/201 | (2006.01) | |
| H01L 29/205 | (2006.01) | |
| H01L 27/095 | (2006.01) | |
| H01L 23/528 | (2006.01) | |
| H01L 29/417 | (2006.01) | |
| H01L 23/482 | (2006.01) | |
| H01L 29/06 | (2006.01) | |
| H01L 29/16 | (2006.01) | |
| H01L 29/861 | (2006.01) | |
| H01L 29/423 | (2006.01) | |

(52) U.S. Cl.
CPC .......... *H01L 22/32* (2013.01); *H01L 23/4824* (2013.01); *H01L 23/528* (2013.01); *H01L 27/095* (2013.01); *H01L 29/0649* (2013.01); *H01L 29/0657* (2013.01); *H01L 29/1608* (2013.01); *H01L 29/201* (2013.01); *H01L 29/2003* (2013.01); *H01L 29/205* (2013.01); *H01L 29/41758* (2013.01); *H01L 29/7786* (2013.01); *H01L 29/861* (2013.01); *H01L 29/42316* (2013.01); *H01L 2924/0002* (2013.01)

(58) Field of Classification Search
CPC ... H01L 27/095; H01L 23/528; H01L 29/861; H01L 29/41758; H01L 29/7786; H01L 23/4824; H01L 29/0657; H01L 22/14; H01L 22/22; H01L 29/0649; H01L 29/1608
See application file for complete search history.

(56) References Cited

U.S. PATENT DOCUMENTS

| | | | |
|---|---|---|---|
| 4,636,825 A | 1/1987 | Baynes | |
| 4,819,042 A | 4/1989 | Kaufman | |
| 4,821,084 A | 4/1989 | Kinugasa et al. | |
| 5,068,603 A | 11/1991 | Mahoney | |
| 5,087,950 A | 2/1992 | Katano | |
| 5,355,008 A | 10/1994 | Moyer et al. | |
| 5,447,876 A | 9/1995 | Moyer et al. | |
| 5,633,479 A | 5/1997 | Hirano | |
| 5,643,832 A | 7/1997 | Kim | |
| 5,714,784 A | 2/1998 | Ker et al. | |
| 5,767,546 A | 6/1998 | Williams et al. | |
| 5,789,791 A | 8/1998 | Bergemont | |
| 5,852,315 A | 12/1998 | Ker et al. | |
| 5,883,407 A | 3/1999 | Kunii et al. | |
| 6,037,822 A | 3/2000 | Rao et al. | |
| 6,084,266 A | 7/2000 | Jan | |
| 6,100,549 A | 8/2000 | Weitzel et al. | |
| 6,159,841 A | 12/2000 | Williams et al. | |
| 6,264,167 B1 | 7/2001 | Hamazawa | |
| 6,353,290 B1 | 3/2002 | Glenn et al. | |
| 6,388,292 B1 | 5/2002 | Lin | |
| 6,477,023 B1 | 11/2002 | Tang et al. | |
| 6,514,779 B1 | 2/2003 | Ryu et al. | |
| 6,555,873 B2 | 4/2003 | Disney et al. | |
| 6,639,277 B2 | 10/2003 | Rumennik et al. | |
| 6,653,740 B2 | 11/2003 | Kinzer et al. | |
| 6,713,793 B1 | 3/2004 | Suzuki et al. | |
| 6,713,823 B1 | 3/2004 | Nickel | |
| 6,737,714 B2 | 5/2004 | Masuda et al. | |
| 6,777,278 B2 | 8/2004 | Smith | |
| 6,878,593 B2 | 4/2005 | Khan et al. | |
| 6,897,561 B2 | 5/2005 | Nemtsev et al. | |
| 6,903,460 B2 | 6/2005 | Fukuda et al. | |
| 6,930,329 B2 | 8/2005 | Koide | |
| 6,958,543 B2 | 10/2005 | Nakayama | |
| 6,972,464 B2 | 12/2005 | Shen | |
| 7,033,936 B1 | 4/2006 | Green | |
| 7,078,775 B2 | 7/2006 | Yi et al. | |
| 7,132,717 B2 | 11/2006 | Su et al. | |
| 7,166,898 B2 | 1/2007 | Briere | |
| 7,233,028 B2 | 6/2007 | Weeks et al. | |
| 7,233,610 B2 | 6/2007 | Lan et al. | |
| 7,250,641 B2 | 7/2007 | Saito et al. | |
| 7,253,486 B2 | 8/2007 | Green et al. | |
| 7,294,892 B2 | 11/2007 | Chen | |
| 7,327,007 B2 | 2/2008 | Shimizu | |
| 7,335,916 B2 | 2/2008 | Kim et al. | |
| 7,352,016 B2 | 4/2008 | Nagy et al. | |
| 7,398,498 B2 | 7/2008 | Teig et al. | |
| 7,449,762 B1 | 11/2008 | Singh | |
| 7,491,986 B2 | 2/2009 | Kumagae et al. | |
| 7,550,821 B2 | 6/2009 | Shibata et al. | |
| 7,622,318 B2 | 11/2009 | Kobayashi et al. | |
| 7,622,779 B2 | 11/2009 | Cheng et al. | |
| 7,675,131 B2 | 3/2010 | Derderian | |
| 7,727,332 B2 | 6/2010 | Habel et al. | |
| 7,732,306 B2 | 6/2010 | Arena et al. | |
| 7,750,369 B2 | 7/2010 | Ohta et al. | |
| 8,085,553 B1 | 12/2011 | Lacap et al. | |
| 8,134,205 B2 | 3/2012 | Tang et al. | |
| 8,680,676 B1 | 3/2014 | Jergovic et al. | |
| 8,791,508 B2 | 7/2014 | Roberts et al. | |
| 9,153,509 B2 * | 10/2015 | Klowak ................. H01L 22/32 |
| 2001/0015447 A1 | 8/2001 | Shinomiya | |
| 2002/0013042 A1 | 1/2002 | Morkoc | |
| 2002/0076851 A1 | 6/2002 | Eden et al. | |
| 2002/0179005 A1 | 12/2002 | Koike et al. | |
| 2002/0197841 A1 | 12/2002 | Nagai et al. | |
| 2003/0032288 A1 | 2/2003 | Kozaki et al. | |
| 2003/0062622 A1 | 4/2003 | Pavier et al. | |
| 2003/0136984 A1 | 7/2003 | Masuda et al. | |
| 2003/0183160 A1 | 10/2003 | Fujikura et al. | |
| 2003/0209759 A1 | 11/2003 | Blanchard | |
| 2003/0218246 A1 | 11/2003 | Abe et al. | |
| 2004/0048409 A1 | 3/2004 | Biwa et al. | |
| 2004/0125577 A1 | 7/2004 | Vinciarelli et al. | |
| 2005/0056865 A1 | 3/2005 | Tsuchiya et al. | |
| 2005/0093099 A1 | 5/2005 | Koike et al. | |
| 2005/0167775 A1 | 8/2005 | Nagy et al. | |
| 2005/0274977 A1 | 12/2005 | Saito et al. | |
| 2006/0049417 A1 | 3/2006 | Li et al. | |
| 2006/0060895 A1 | 3/2006 | Hikita et al. | |
| 2006/0073621 A1 | 4/2006 | Kneissel et al. | |
| 2006/0131745 A1 | 6/2006 | Yutani | |
| 2006/0138565 A1 | 6/2006 | Su et al. | |
| 2006/0273347 A1 | 12/2006 | Hikita et al. | |
| 2007/0072320 A1 | 3/2007 | Frayssinet et al. | |
| 2007/0096262 A1 | 5/2007 | Takasone | |
| 2007/0210333 A1 | 9/2007 | Lidow et al. | |
| 2008/0073670 A1 | 3/2008 | Yang et al. | |
| 2008/0083932 A1 | 4/2008 | Briere | |
| 2008/0087915 A1 | 4/2008 | Uemoto et al. | |
| 2008/0093638 A1 | 4/2008 | Kobayashi | |
| 2008/0128752 A1 | 6/2008 | Wu | |
| 2008/0149940 A1 | 6/2008 | Shibata et al. | |
| 2008/0149965 A1 | 6/2008 | Kaibara et al. | |
| 2008/0173898 A1 | 7/2008 | Ohmaki | |
| 2008/0224332 A1 | 9/2008 | Tam | |
| 2008/0230786 A1 | 9/2008 | Heikman et al. | |
| 2008/0246058 A1 | 10/2008 | Nagy et al. | |

(56) References Cited

U.S. PATENT DOCUMENTS

| | | |
|---|---|---|
| 2008/0274621 A1 | 11/2008 | Beach et al. |
| 2008/0303042 A1 | 12/2008 | Minato et al. |
| 2009/0026506 A1 | 1/2009 | Matsumiya et al. |
| 2009/0045394 A1 | 2/2009 | Smeeton et al. |
| 2009/0086506 A1 | 4/2009 | Okumura |
| 2009/0242961 A1 | 10/2009 | Tang et al. |
| 2009/0267188 A1 | 10/2009 | Piner et al. |
| 2009/0315123 A1 | 12/2009 | Wu |
| 2010/0019850 A1 | 1/2010 | Nagy et al. |
| 2010/0059761 A1 | 3/2010 | Horii et al. |
| 2010/0072489 A1 | 3/2010 | Mclaurin et al. |
| 2010/0072576 A1 | 3/2010 | Arena |
| 2010/0133548 A1 | 6/2010 | Arena et al. |
| 2010/0163979 A1 | 7/2010 | Hebert |
| 2010/0258843 A1 | 10/2010 | Lidow et al. |
| 2010/0297960 A1 | 11/2010 | Ogawa et al. |
| 2011/0031529 A1 | 2/2011 | Miura et al. |
| 2011/0031532 A1 | 2/2011 | Kikkawa et al. |
| 2011/0041890 A1 | 2/2011 | Sheats |
| 2011/0057311 A1 | 3/2011 | Yutani |
| 2011/0079795 A1 | 4/2011 | Nagai |
| 2011/0115029 A1 | 5/2011 | Van Den Boom |
| 2011/0186858 A1 | 8/2011 | Roberts et al. |
| 2011/0193096 A1 | 8/2011 | Imada |
| 2012/0119305 A1 | 5/2012 | Chen et al. |
| 2012/0126290 A1 | 5/2012 | Uemoto et al. |
| 2012/0138950 A1 | 6/2012 | Roberts et al. |
| 2012/0306024 A1 | 12/2012 | Hilt et al. |
| 2012/0315743 A1 | 12/2012 | Kikkawa et al. |
| 2013/0049010 A1 | 2/2013 | Roberts et al. |
| 2013/0228789 A1 | 9/2013 | Yamamura |
| 2015/0318353 A1 | 11/2015 | Roberts et al. |

FOREIGN PATENT DOCUMENTS

| | | |
|---|---|---|
| EP | 0221431 A2 | 5/1989 |
| EP | 1142721 A1 | 10/2001 |
| EP | 1973163 | 9/2008 |
| EP | 2151852 | 2/2010 |
| JP | 5047575 | 4/1975 |
| JP | 5089263 | 7/1975 |
| JP | 5181067 | 6/1976 |
| JP | S55-113378 A | 9/1980 |
| JP | S57-106174 A | 7/1982 |
| JP | 5868954 | 4/1983 |
| JP | H 5-56864 B | 8/1993 |
| JP | H08-181307 A | 7/1996 |
| JP | 11214408 | 8/1999 |
| JP | H11-214408 | 8/1999 |
| JP | 2000208759 A | 7/2000 |
| JP | 2001-28425 A | 1/2001 |
| JP | 2006-229218 A | 8/2006 |
| JP | 2007103451 | 4/2007 |
| JP | 2007305954 A | 11/2007 |
| JP | 2008-108794 A | 5/2008 |
| JP | 2008-159681 A | 7/2008 |
| JP | 2008177527 A | 7/2008 |
| JP | 2013-520000 A | 5/2013 |
| WO | 2010015302 | 2/2010 |
| WO | 2011014951 A1 | 2/2011 |
| WO | 2011/127568 | 10/2011 |
| WO | 2011127568 A1 | 10/2011 |

OTHER PUBLICATIONS

Koudymov et al., "Mechanism of Current Collapse Removal in Field-Plated Nitride HFETs", 2005, IEEE Electron Device Letters, vol. 26, No. 10, p. 704-706.

Xing et al., "High Breakdown Voltage AlGaN-GaN HEMTs Achieved by Multiple Field Plates", 2004 IEEE Electron Device Letters, vol. 25, No. 4, p. 161-163.

Wai Tung NG et al.; "High SPeed CMOS Output Stage for Integrated DC-DC Converters"; Solid state and Integrated Circuit Technology 2008; ICSICT 2009; pp. 1909-1912.

A. Yoo et al. "High Performance Low-Voltage Powers MOSFETs with Hybrid Waffle Layout Structure in a 0.25 μm Standard CMOS Process", 20th International Symposium on Power Semiconductor Devices and ICs (ISPD '08). p. 95 (2008).

S. Lee. "Distributed Effects in Power Transistors and the Optimization of the Layouts of AlGaN/GaN HFETs". Doctoral dissertation, Graduate School of Ohio State University, Ohio State University. (2006).

Sang Lam et al. An enhanced compact waffle MOSFET with low drain capacitance from a standard submicron CMOS technology. Solid State Electronics 47 (2003). Pergamon Press. pp. 785-789.

R. Vemuru. "Layout Comparison of MOSFETs with Large W/L Ratios". Electronic Letters. vol. 28. No. 25. pp. 2327-2329. (1992).

L. Baker et al. "A 'Waffle' Layout Technique Strengthens the ESD Hardness of the NMOS Transistor". EOS/ESD Symp. Proc. EOS-11. pp. 175-181. (1989).

Ming-Dou Ker et al. "Area-Efficient Layout Design for CMOS Output Transistors". IEEE Transactions on Electron Devices. vol. 44. No. 4. Apr. (1997).

W. Saito et al., "High Breakdown Voltage AlGaN-GaN Power-HEMT Design and High Current Density Switxhing Behaviour", IEEE Transactions on Electron Devices, vol. 50, No. 12, p. 2528-2531, (2003).

Notice of Reasons for Rejection with cited references; JP 2013-50477; Roberts, et al. (Applicant's related application).

European Search Report issued on European Patent Application No. 14859004.5 dated Aug. 23, 2016.

* cited by examiner

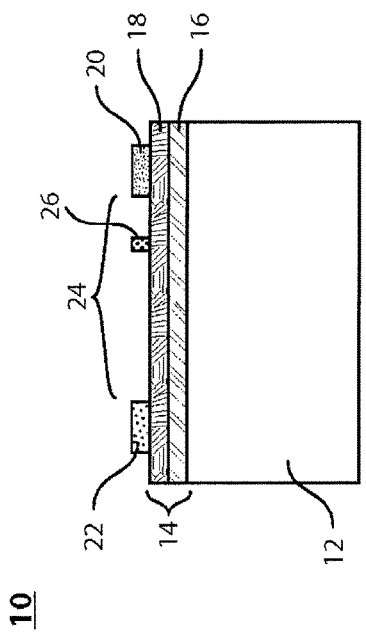
FIG. 1A (PRIOR ART)
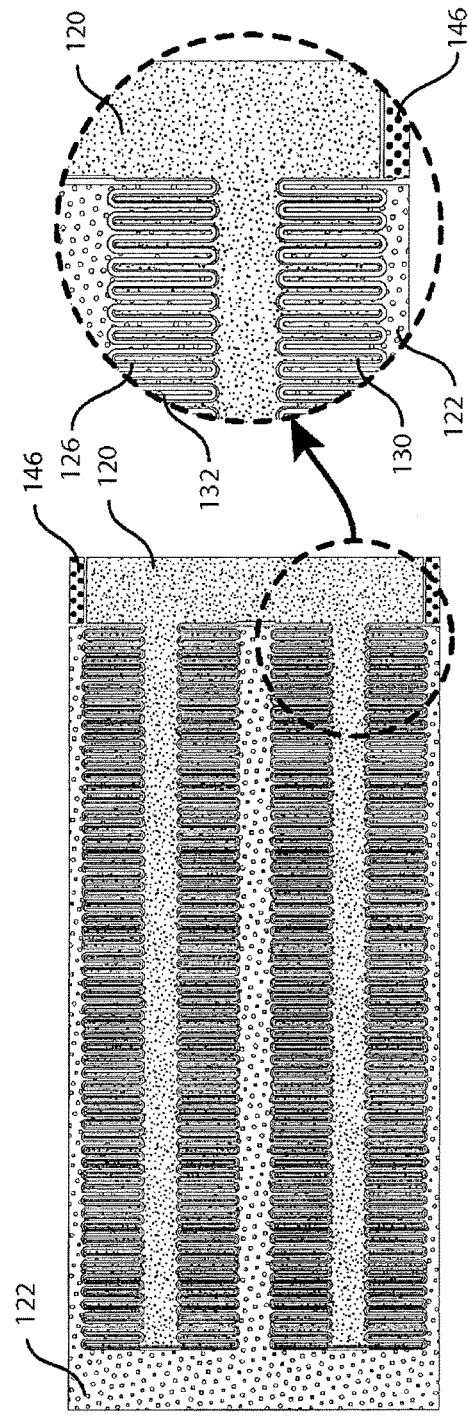
FIG. 1B (PRIOR ART)
FIG. 1C (PRIOR ART)

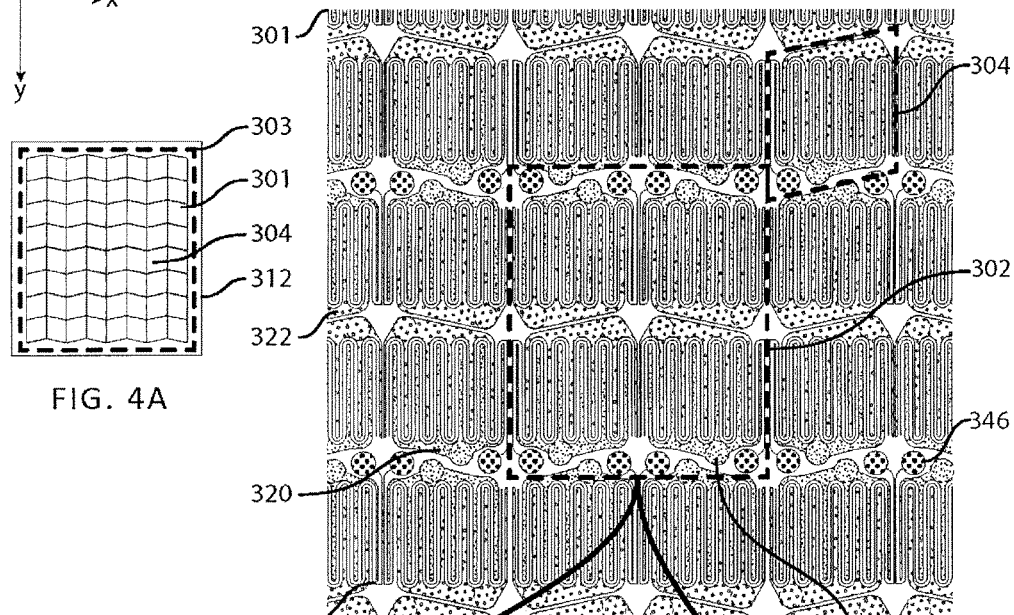
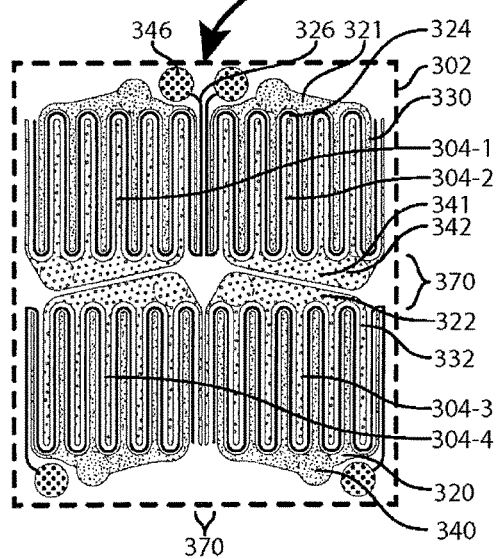
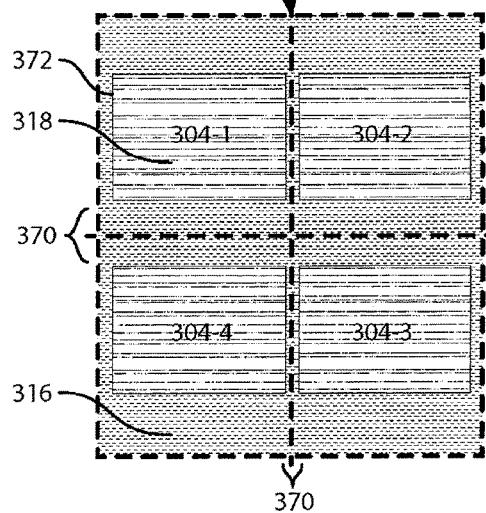
FIG. 4A
FIG. 4B
FIG. 4C
FIG. 4D

1000

1100

# FAULT TOLERANT DESIGN FOR LARGE AREA NITRIDE SEMICONDUCTOR DEVICES

CROSS-REFERENCE TO RELATED APPLICATIONS

This application claims priority from U.S. provisional patent application No. 61/896,871, entitled "Fault Tolerant Design for Large Area Nitride Semiconductor Devices" filed Oct. 29, 2013, which is incorporated herein by reference in its entirety.

This application is related to: U.S. patent application Ser. No. 13/388,694, entitled "Island matrixed gallium nitride microwave and power switching transistors", which is a national entry of PCT International application no. PCT/CA2010/001202, filed Aug. 4, 2010, designating the United States, and which claims priority from U.S. provisional patent application No. 61/231,139, filed Aug. 4, 2009; U.S. patent application Ser. No. 13/641,003, entitled "High density gallium nitride devices using island topology", which is a national entry of PCT International application no. PCT/CA2011/000396, filed Apr. 13, 2011, designating the United States, and which claims priority from U.S. provisional patent application No. 61/323,470, filed Apr. 13, 2010; and U.S. patent application Ser. No. 13/020,712, entitled "Gallium nitride power devices using island topography", filed Feb. 3, 2011, which is a continuation in part of U.S. patent application Ser. Nos. 13/388,694 and 13/641,003, claiming priority from U.S. provisional patent applications Nos. 61/231,139 and 61/323,470. All these applications are incorporated herein by reference, in their entirety.

TECHNICAL FIELD

This invention relates to semiconductor devices and systems for electronic power conversion circuits, and more particularly relates to devices and systems using high performance power transistors, such as gallium nitride high electron mobility transistors (GaN HEMTs).

BACKGROUND ART

The above referenced related patent applications disclose semiconductor devices, such as gallium nitride (GaN) semiconductor power devices, using an island electrode topology.

For example, as disclosed in the above referenced co-pending U.S. patent application Ser. No. 13/020,712, entitled "Gallium nitride power devices using island topography", GaN transistors with ultra-low on-resistance can be produced using Island Topology™. This particular island electrode topology provides a compact structure with a gate width more than double that of a conventional multi-finger design of a similar device size, with superior current handling per unit area. A breakdown voltage exceeding 1200V can be achieved.

Faults or defective areas may, for example, be caused by defects in the semiconductor layer, e.g. caused by faults in the growth of gallium nitride on a silicon substrate, which has a different crystal structure. While GaN may be grown on some substrates, e.g. SiC, with lower defect densities, it is desirable to be able to use less expensive GaN-on-silicon substrates, which are known to have a higher defect density per unit area.

A fault in the active channel region of a conventional large gate width, multi-finger GaN transistor design, such as shown in FIG. 1B, can cause failure of the entire device. As the device area increases, and depending on the defect density in active regions of the GaN semiconductor layer, the probability of one or more faults or defects increases.

As disclosed in U.S. patent application Ser. No. 13/020,712, in a GaN transistor using Island Topology™, such as illustrated in FIGS. 2A and 2B, it is possible to isolate defective areas, i.e., by disconnection of the gate strap from a gate electrode element in a defective area. If needed, a disconnected gate element may also be grounded to the source electrode. Where bump connections are used to the source and/or drain electrodes, individual source or drain island electrodes may be electrically isolated by removing individual bump connections in defective regions. Thus, an island electrode topology provides the ability to isolate faults or defective areas. Nevertheless, for a semiconductor layer having a particular defect density per unit area, as the device area increases, the probability of finding a defect in the device area increases accordingly. FIG. 3 shows a graph illustrating an example of die yield vs. device size for a conventional design of a GaN semiconductor transistor having a large gate width Wg, such as shown in FIG. 1.

As will be described in more detail below, in view of the degree of interconnection of the gate electrodes in this structure, and the gate width per gate connection, disconnection of only one gate contact significantly decreases the overall gate width Wg of the device. For example, for a defective middle gate connection, its removal or isolation effectively deactivates 7 adjacent sets of source/drain and gate connections. In such an arrangement, for a multi-island device fabricated on a GaN-on-silicon wafer, the yield of devices having an acceptable gate width Wg may be low, depending on the defect density per unit area of the substrate wafer.

Moreover, for large gate width transistors using a large number of island electrodes, it will be apparent that it becomes complex and time consuming to electrically test each element separately, i.e., to electrically test each source island, drain island and gate electrode combination, to find defective elements or defective areas of the semiconductor layer.

Thus, it would be desirable to provide systems and devices based on an island topology, which provide improved fault tolerance and/or which facilitate electrical testing for defect detection and mitigation.

The present invention seeks to overcome, or mitigate, one or more of the above mentioned limitations of these known systems and devices using an island topology, or at least provide an alternative.

SUMMARY OF INVENTION

Thus, aspects of the invention provide systems and devices based on an island topology that provide improved fault tolerance and/or facilitate electrical testing and defect isolation.

Aspects of the invention provide nitride semiconductor devices, including GaN transistors and diodes based on an Isolated Island Topology™.

One aspect of the invention provides a device structure for a nitride semiconductor transistor comprising:

a substrate having a nitride semiconductor layer formed on a device area of the substrate and defining a plurality of active regions for an array of islands of a multi-island transistor, the array of islands extending in first and second directions over the device area, each of said active regions comprising a two dimensional electron gas (2DEG) region isolated from adjacent active regions by an intervening inactive region of the device area;

each island having a source electrode, a drain electrode and a gate electrode formed on a respective active region of the island, each source electrode having a plurality of source peninsulas, each drain electrode having a plurality of drain peninsulas, the source and drain peninsulas being interleaved and spaced apart over the active region of the island to define a channel region therebetween, and the gate electrode formed on the nitride semiconductor layer over the channel region, the gate electrode running between the source and drain peninsulas across the island;

the source, drain and gate electrodes of each island each having, respectively, a source contact area, a drain contact area and gate contact area; and the source, drain and gate electrodes of each island of the array of islands being arranged so that at least some electrodes of each island are electrically isolated from electrodes of neighbouring islands in at least one of said first and second directions. The source, drain and gate electrodes contact areas of individual islands each comprise a contact pad having at least a minimum size required for electrical probing and testing, to identify defective islands.

The array of islands may comprise an n×m matrix of n rows and m columns of islands. In one arrangement, the source contact areas and gate contact areas of the nth and n−1 th rows of islands are positioned over inactive regions of the device area between the n−1th and nth rows of islands; and drain contact areas of the nth and n+1th rows of islands are positioned over inactive regions of the device area between the nth and n+1 th rows of islands.

In some embodiments, for each island, all electrodes (i.e., source, drain and gate electrodes) of each island are defined separately from, and electrically isolated from, all the electrodes of neighbouring islands, in both directions (i.e., row-wise and column-wise) of the array. Electrical isolation of each of the source, drain and gate electrodes of each island facilitates testing and isolation of defective islands during fabrication of the transistor.

The active area or region of each island defined by the 2DEG region of the nitride semiconductor hetero-structure may also be isolated from active regions of neighbouring islands. For example, for a gallium nitride/aluminum gallium nitride (GaN/AlGaN) hetero-structure, the GaN layer may extend over the entire device area, while the AlGaN layer is patterned to define a rectangular active area comprising a 2DEG region on each island of the array. In regions in between, the GaN layer only (without an overlying AlGaN layer) provides an inactive region of the semiconductor layer without a 2DEG region, which provides another level of isolation between neighbouring islands.

In some embodiments, an active area/region comprising a 2DEG region may extend laterally through a group or set of neighbouring islands, e.g., a row of islands or a column of islands, or a group of neighbouring islands in a row-wise and/or column-wise direction.

In other embodiments, only some electrodes are electrically isolated from those of neighbouring islands, and some electrodes may be electrically connected. For example, in some embodiments, one or more neighbouring islands share a common source electrode. In some embodiments, electrodes of a set of neighbouring islands are interconnected in one direction of the array, e.g., in a row-wise direction of the array of islands, while electrodes of each island are electrically isolated in a second direction, i.e., in a column-wise direction of the array.

The device structure for a transistor further comprises an overlying interconnect structure comprising one or more dielectric (insulating) layers and metallization layers providing: a source interconnection (e.g., one or more source straps) interconnecting the source electrodes of multiple neighbouring islands in parallel;

a drain interconnection (e.g., one or more drain straps) interconnecting the multiple neighbouring drain electrodes in parallel; and a gate interconnection (e.g., one or more gate straps) interconnecting the gate electrodes of multiple islands to form a common gate, having a large gate width Wg.

Advantageously, the source, drain and gate interconnections are configured to provide electrical isolation of one or more of source, drain and gate electrodes of any defective islands, to enable yield enhancement.

For example, for a defective island, the electrical isolation comprises a layer of electrically insulating material isolating the source, drain and gate contacts of the defective island from the respective overlying source, drain and gate straps.

In other embodiments, the source, drain and gate contacts of defective islands may be selectively isolated from the overlying gate, source and drain interconnections.

Another aspect of the invention provides a device structure for a nitride semiconductor diode comprising: a substrate having a nitride semiconductor layer defining active regions of a device area on the substrate, said active regions comprising 2DEG regions; the device area comprising an array of islands extending in first and second directions over the device area; each island having an anode electrode and a cathode electrode formed on an active region of the island, spaced apart over the active region of the island to define a channel region therebetween; each anode electrode having an anode contact area, each cathode electrode having a cathode contact area; at least some the anode and cathode electrodes of each island of the array of islands being arranged so as to be electrically isolated from anode and cathode electrodes of neighbouring islands in at least one of said first and second directions.

In diodes according to some embodiments, all anode and cathode electrodes are electrically isolated from anode and cathode electrodes of neighbouring islands in both directions. The device structure for a diode further comprises an overlying interconnect structure comprising one or more dielectric (insulating) layers and metallization layers providing: an anode interconnection interconnecting the anode electrodes in parallel; a cathode interconnection interconnecting the cathode electrodes in parallel.

Advantageously, the anode and cathode interconnections are configured to provide electrical isolation of anode and cathode electrodes of defective islands.

Another aspect of the invention provides a testing and isolation methodology, i.e., a method for testing and fabrication of a device structure for a transistor, comprising the steps of: providing a device structure as described above, probing and electrically testing electrodes of each island of the array of islands, identifying and/or mapping defective islands; and selectively providing source, drain and gate electrical interconnections only to respective source, drain and gate electrodes of islands other than said defective islands, thereby electrically isolating defective islands of the transistor.

Yet another aspect of the invention provides a hybrid device/system/assembly comprising: a GaN-on-silicon substrate, at least one large-area GaN isolated island topology transistor formed on an area of the substrate, a MOSFET (Metal Oxide Semiconductor Field Effect Transistor) driver mounted on the substrate adjacent to the GaN transistor, directly interconnected in cascade configuration.

Thus, device structures, devices and systems are provided based on an isolated island topology, wherein a nitride semiconductor layer defines active regions of a device area on the substrate, said active regions comprising 2DEG regions, for an array or matrix of a plurality of islands. Each transistor island has a respective source electrode, a drain electrode and a gate electrode. Each diode island has a respective anode and cathode electrode. At least some electrodes of each island are electrically isolated from corresponding electrodes of neighbouring islands, in at least one direction.

In a large gate width transistor of some embodiments, for example, isolation of islands comprises selective isolation of some or all of the source, drain and gate electrodes of each island from source drain and gate electrodes of neighbouring islands, in one or both directions laterally. Additionally, patterning of the active region comprising the 2DEG regions may allow for inactive areas of the semiconductor layer between islands or between sets of islands in at least one direction. After electrical testing to identify defective islands, the overlying interconnect structure is then formed to provide source, drain and gate interconnections to all good islands, while defective islands are electrically isolated.

In this arrangement, all electrodes of each island can be individually electrically tested independently of electrodes of neighbouring islands. Thus, a map of good islands and defective islands across the entire area of the device, or entire wafer, can be generated. Furthermore, because each island of the array is isolated, when islands are interconnected to form a multi-island transistor or diode, electrodes of defective islands are not connected, thus isolating defective islands. For example, in a large area transistor, in each defective island, each of the source, drain and gate electrodes can be isolated with minimal disruption to connections to source, drain and gate electrodes of neighbouring good islands. Removal of all connection elements for an island, i.e., each of the source, drain, and gate connections, may be advantageous to reduce any residual capacitances, electrical shorts, or other issues.

Accordingly another aspect of the invention provides a nitride semiconductor device comprising:

a substrate having a nitride semiconductor layer formed on a device area of the substrate and defining a plurality of active regions for an array of islands of a multi-island transistor, the array of islands extending in first and second directions over the device area;

each of said active regions comprising a two dimensional electron gas (2DEG) region isolated from adjacent active regions by an intervening inactive region of the device area;

each island having a source electrode, a drain electrode and a gate electrode formed on a respective active region of the island, each source electrode having a plurality of source peninsulas, each drain electrode having a plurality of drain peninsulas, the source and drain peninsulas being interleaved and spaced apart over the active region of the island to define a channel region therebetween, and the gate electrode formed on the nitride semiconductor layer over the channel region, the gate electrode running between the source and drain peninsulas across the island;

each source electrode having a source contact area, each drain electrode having a drain contact area, each gate electrode having a gate contact area;
the source, drain and gate electrodes of each island of the array of islands being arranged so that each island is electrically isolated from neighbouring islands in at least one of said first and second directions;

an overlying isolation layer providing contact openings only to contact areas of non-defective islands while isolating contact areas of defective islands;
a source interconnection interconnecting the source electrodes in parallel; a drain interconnection interconnecting the source electrodes in parallel; a gate interconnection interconnecting the gate electrodes;

said source, drain and gate interconnections thereby selectively connecting non-defective islands and providing electrical isolation of defective islands.

Another aspect of the invention provides a nitride semiconductor device comprising:

a substrate having a nitride semiconductor layer formed on a device area of the substrate and defining a plurality of active regions for an array of islands of a multi-island diode, the array of islands extending in first and second directions over the device area;

each of said active regions comprising a two dimensional electron gas (2DEG) region isolated from adjacent active regions by an intervening inactive region of the device area;

each island having an anode electrode and a cathode electrode formed on a respective active region of the island, spaced apart over the active region of the island to define a channel region therebetween;

each anode electrode having an anode contact area, each cathode electrode having a cathode contact area;

the anode and cathode electrodes of each island of the array of islands being arranged so that each island is electrically isolated from neighboring islands in at least one of said first and second directions;

an overlying isolation layer providing contact openings only to contact areas of non-defective islands and isolating contact areas of defective islands;

an anode interconnection interconnecting the anode island electrodes in parallel;

a cathode interconnection interconnecting the cathode island electrodes in parallel; and said anode and cathode interconnections thereby selectively connecting non-defective islands and providing electrical isolation of defective islands.

As will be apparent, this isolated island structure is also applicable to multi-island diodes using a similar multi-island topology with selective interconnection of non-defective islands. This technology is particularly applicable to increasing yield when fabricating large area devices on substrates with higher defect densities per unit area. For example, the test methodology and interconnect scheme is particularly applicable to nitride semiconductors, such as those comprising a GaN hetero-structure formed on lower cost silicon substrates.

In one embodiment, the semiconductor device structure comprises an array of island electrodes, the array being arranged as a plurality of islands, each island containing at least one pair of island electrodes acting respectively as source and drain electrodes with a gate electrode extending between each pair of island electrodes, and respective contacts to each source, drain and gate electrode, and each island being completely electrically isolated from its neighbours. Thus, a multi-island device structure is provided that facilitates electrical testing of each individual island, for identification and mapping of good and bad (non-defective and defective) islands of the array.

Following testing, and identification of good and bad islands, electrical connections between islands of the array are selectively provided with isolation of defective islands.

For example, bad islands, which are defective or fail to meet electrical specifications, may be isolated after testing by providing a dielectric insulating coating to one or more of the gate, source, and drain contact (test) pads of the defective island. Alternatively, a dielectric insulating layer may be provided over the entire array, and then contact openings selectively opened to source, drain and gate electrodes of all good islands, as required, while defective islands are isolated by the insulating layer over their contacts. The insulating layer may, for example, comprise a layer of a suitable polyimide dielectric, which may be patterned to define the openings over each contact area that is to be electrically interconnected. Deposition of polyimide may comprise 3D printing techniques or materials. For example, after electrical testing and mapping of defective cells, patterning of a photosensitive negative-tone polyimide dielectric layer may be accomplished by a combination of conventional mask based exposures, followed by a selective optical exposure using an optical system such as a computer numerical controlled (CNC) two axis machine capable of producing a light beam of similar diameter to the contact pad area to selectively expose and close contact areas of defective cells.

Any suitable interconnect metallization technology may be used for interconnection of good islands. In one embodiment, the electrical interconnect (i.e., good island interconnections) comprises a copper redistribution layer (RDL). While the wasted die area is limited by the interconnect technology, i.e., interconnect pad size, the RDL allows for use of smaller interconnections. Embodiments for systems comprising GaN power transistors may comprise various patterns of interconnect metallization for source, drain and gate connections, e.g., a GaN-on-silicon substrate, on which is defined by one or more multi-island devices. In another alternative, a direct-write e-beam method may be used to define metal tracks to interconnect all good islands.

In some embodiments, contacts may be arranged to facilitate simultaneous testing of pairs or groups of neighbouring islands, and then if a pair or group fails a group test, individual islands in this group can be tested separately to isolate one or more defective islands. For example, if a group or row of islands passes the test, no further sub-testing is required, thus saving a significant amount of test time.

Advantageously, identification and mapping of defective islands in a large area semiconductor device, e.g. a 10 mm×10 mm device, with a large array of island electrodes enables each semiconductor device to be binned based on specifications such as aggregate gate width Wg or other parameters. Thus, the method provides the possibility of obtaining close to 100% yield of devices that are binned based on different specifications.
This testing methodology allows for semiconductor devices to be produced on really large dies, while facilitating practical approaches to testing for defect detection and mapping of large dies, with significantly reduced test time. It then becomes economically feasible to fabricate large area devices with higher yield.

Systems may further comprise one or more respective MOSFET driver circuits mounted on and directly interconnected on the substrate. As an example, for GaN power devices such as switching transistors, the GaN device is fabricated on a large area die, such as a 5 mm×7 mm die, which comprises a 5 mm×5 mm GaN transistor and an adjacent die area to which a driver MOSFET device is mounted and directly electrically connected in cascode configuration, so as to provide a normally-off device. For example the driver MOSFET may be provided with a back side/substrate drain contact, which directly contacts the source connection of the GaN transistor. This provides a silicon-on-GaN-on-silicon device structure, with a very low inductance interconnection between the two devices.

Advantageously, embodiments of devices and systems provide structures which allow for at least one of improved fault tolerance, device testing and defect isolation.

The foregoing and other objects, features, aspects and advantages of the present invention will become more apparent from the following detailed description, taken in conjunction with the accompanying drawings, of preferred embodiments of the invention, which description is by way of example only.

BRIEF DESCRIPTION OF THE DRAWINGS

In the drawings, identical or corresponding elements in the different Figures have the same reference numeral, or corresponding elements have reference numerals incremented by 100 in successive Figures.

FIG. 1A (Prior Art) shows a schematic cross-sectional diagram representing a simplified GaN transistor;

FIG. 1B (Prior Art) shows a schematic plan view of a large area GaN transistor to illustrate a conventional arrangement of source, drain and gate electrodes, wherein the source and drain electrodes each comprise a plurality of interdigitated fingers with a gate electrode running between, to provide a power transistor with a large gate width Wg;

FIG. 1C (Prior Art) shows an enlarged view of part of FIG. 1B;

FIG. 4A illustrates schematically a semiconductor device for a transistor comprising a multi-island array of plurality of isolated islands according to a first embodiment of the invention;

FIG. 4B illustrates schematically a plan view of part of a large area GaN transistor structure according to the first embodiment of the present invention, comprising a multi-island array (n×m matrix of rows and columns) of a plurality of electrically isolated islands, each island comprising a source electrode, a drain electrode, and a gate electrode, and respective source, drain and gate contact pads, with a dashed outline indicating one building block of four islands;

FIG. 4C illustrates schematically an enlarged plan view of the building block of four electrically isolated islands of the first embodiment;

FIG. 4D illustrates schematically a view of active 2DEG regions of the underlying GaN semiconductor layer of the structure shown in FIG. 4B;

DETAILED DESCRIPTION OF PREFERRED EMBODIMENTS

Figures 2A, 2B:
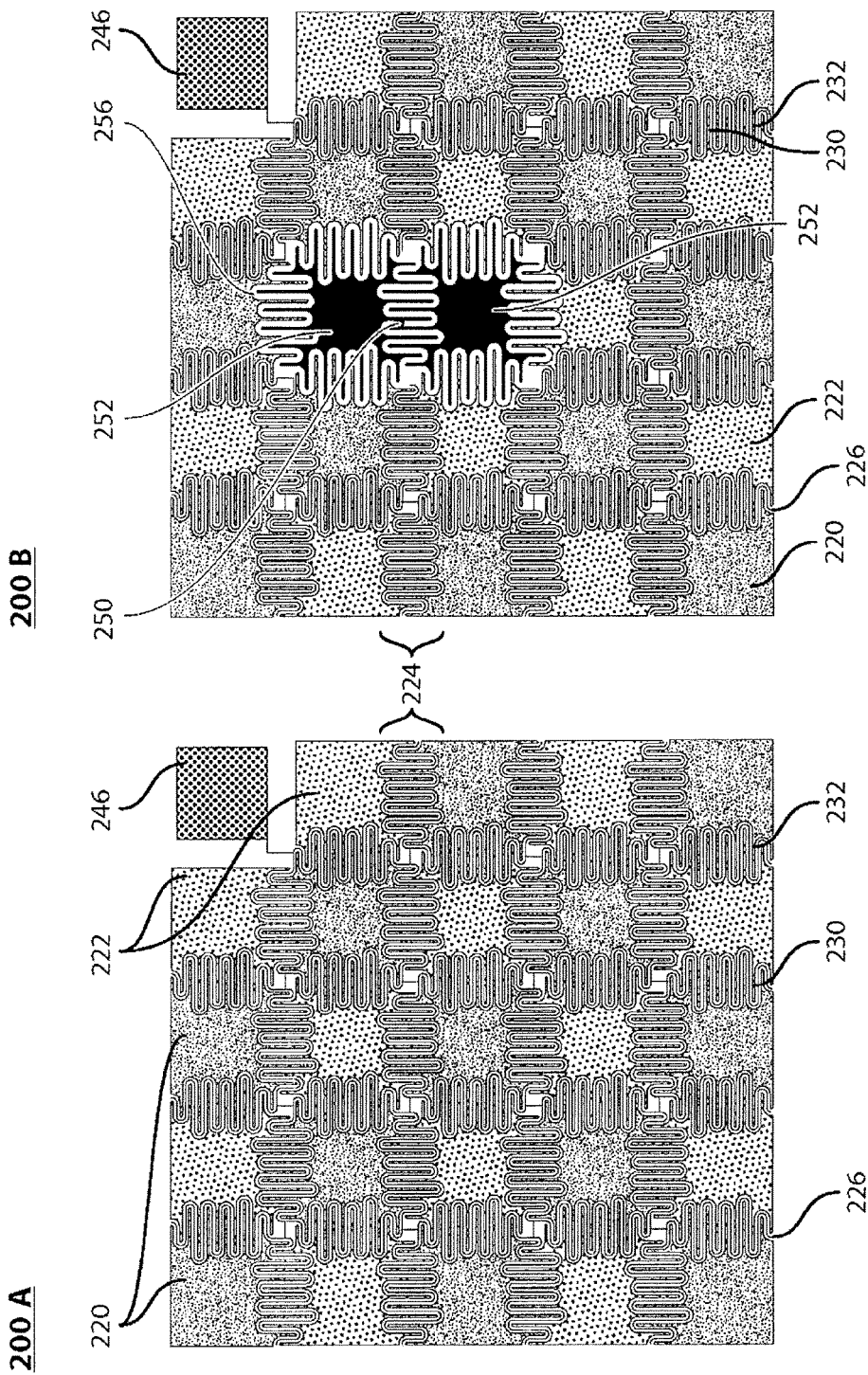
FIG. 2A (Prior Art) illustrates schematically a plan view of a GaN power transistor structure using island topology with castellated island electrodes.
FIG. 2B (Prior Art) illustrates schematically a plan view of a GaN power transistor structure using island topology with castellated island electrodes, illustrating fault isolation.
Figure 3:
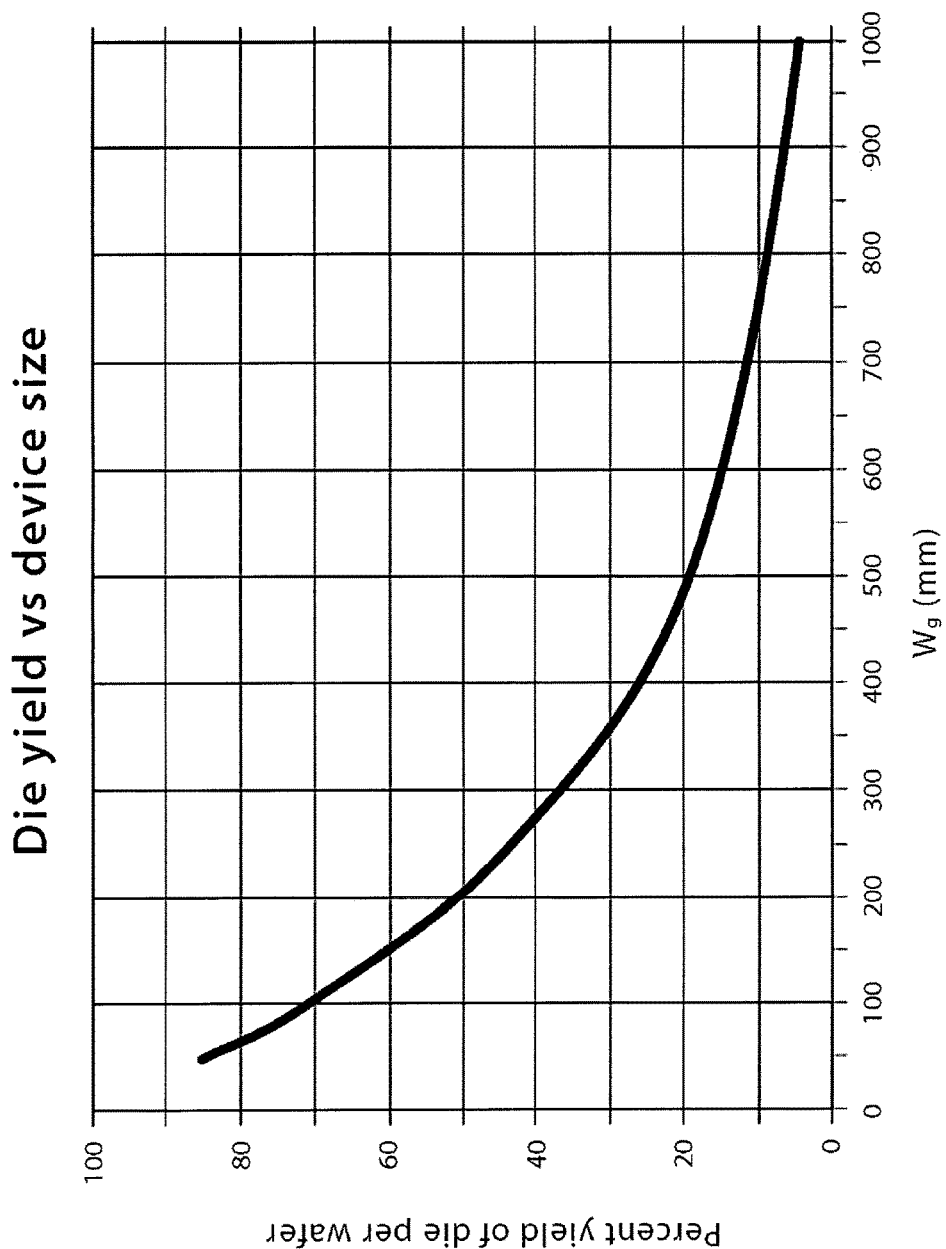
FIG. 3 (Prior Art) shows a graph illustrating die yield vs. device size for a large gate width Wg GaN transistor, such as shown in FIG. 1B.

FIG. 1A shows a schematic diagram of a simple GaN transistor 10. The GaN power transistor 10 comprises a substrate 12, e.g., a silicon or silicon carbide wafer, on which an active GaN semiconductor layer 14 is formed. The GaN semiconductor layer 14 comprises, for example, a GaN/AlGaN hetero-structure layer, i.e., a layer of GaN 16 and an overlying layer of AlGaN 18 to form an active region comprising a two dimensional electron gas (2DEG). A source electrode 20 and a drain electrode 22 are provided on the active GaN semiconductor layer 14 to define a channel region 24 in the semiconductor layer between the source and drain electrodes, and a gate electrode 26 is provided over the channel region. In subsequent Figures, similar reference numerals, incremented by 100 in each successive figure, will be used to refer to these elements of each GaN transistor.

In practice, to provide a large area GaN power transistor with a large gate width Wg, e.g., for use in high voltage and high current applications, a device structure 100 such as shown in FIG. 1B is conventionally used. The source and drain electrodes, 120 and 122, respectively, each comprise a plurality of fingers 130 and 132, respectively. The fingers 130 and 132 are interdigitated along the length L of the substrate. As shown more clearly in the enlarged schematic diagram of FIG. 1C, a gate electrode 126 runs from a gate contact 146, between each of the source and drain fingers 130 and 132, to provide a device with a large gate width Wg per unit area of the die. As an example, a 650 Volt device of this structure, which has an area of about 12 mm$^2$, can provide a gate width of 300 mm. However, it will be apparent that a fault in the active region of the semiconductor substrate at any location in the active 2DEG channel region will cause failure of the entire device, thus significantly reducing die yield per wafer.

As the device area increases, for a given defect density in the semiconductor layer, the probability of one or more faults or defects increases.

A schematic diagram showing a GaN power transistor 200A based on an island electrode topology with castellated island electrodes is shown in FIG. 2A. This structure is similar to that disclosed in the above referenced, related U.S. patent application Ser. No. 13/020,712. This structure comprises a substrate, i.e., a silicon or silicon carbide substrate, with a GaN semiconductor layer formed thereon to provide an active channel region. The GaN semiconductor layer preferably comprises a GaN/AlGaN hetero-structure layer, which provides an active channel region comprising a 2DEG region extending over the active device area of the substrate. An array (matrix) of alternating source island electrodes 220 and drain island electrodes 222 is provided on the GaN semiconductor layer, with each source and drain island electrode being spaced apart to define a channel region 224 therebetween. That is, in this island electrode topology, the array comprises an alternating arrangement of source island electrodes 220 and drain island electrodes 222 in two axial directions.

Each of the source island electrodes 220 comprises a plurality of source peninsulas 230 that extend from sides of the source island electrodes 220 over the channel region. Similarly, each of the drain island electrodes 222 comprises a plurality of drain peninsulas 232 that extend from sides of the drain island electrodes 222 over the channel region. The source and drain electrodes 220 and 222 are arranged so that the respective source and drain peninsulas, 230 and 232 respectively, are interleaved over the active channel regions 224. Except for islands near edges of the array, the source and drain peninsulas, 230 and 232 respectively, extend from four sides of each respective source and drain island. A plurality of interconnected gate electrodes 226 are formed on the semiconductor surface running in the channel regions 224 that extend between each source and drain electrode peninsula, 230 and 232 respectively. The interconnected gate electrodes 226 are connected to a common gate pad 246. This interconnection topology provides a very large gate width Wg per unit area of the substrate. For example, the structure shown in FIG. 2A can provide a gate width Wg per unit area several times greater than that shown in FIG. 1B. In one example, a 5 mm×5 mm chip provided a gate width Wg of >1.2 m.

As disclosed in the above referenced related patent applications, advantageously, the island electrode topology allows for a plurality of low inductance source and drain island connections to be distributed over the active area of the device structure, so that in operation, current is distributed over the device area. Also, as disclosed, selective connection or disconnection of the gate connections, and source and/or drain connections allows for faults to be isolated.

Nevertheless, referring to FIG. 2B, it is apparent that if a fault 250 occurs in a channel region 224 near one of the middle island electrodes, disconnection of gate electrodes and source and/or drain island electrodes, to isolate the fault, requires isolation of the two islands 252, which affects operation of 7 channel regions 256. That is, the faulty channel region plus 6 neighbouring channel regions are deactivated. For the example illustrated, with a 5×5 island array or matrix, where the gate width per channel region is $w_g$, the total gate width of the device is $W_g \sim 38 \times w_g$. Disabling 7 channel regions as shown in FIG. 2B, reduces the total Wg of the device by 7/38 or by >18%.

In the structure shown in FIGS. 2A and 2B, all islands are electrically interconnected. Thus, another challenge with the structure shown in FIGS. 2A and 2B is that testing of the island array to locate faults requires testing of each possible source/drain island pair to locate all faulty channel regions.

A simplified view of a semiconductor device structure 300 comprising a GaN power transistor according to an embodiment of the present invention is shown schematically in FIGS. 4A, 4B, 4C and 4D. FIG. 4A shows the device structure 300 comprising a substrate, or a chip 312, having a device area 303. As illustrated, the device area 303 comprises an array 301 of a plurality of islands 304 extending in first and second directions, x and y, over the device area 303, e.g., an n×n array or matrix of islands. The substrate 312 comprises a silicon or silicon carbide wafer, having a nitride semiconductor structure formed thereon, e.g., similar to that illustrated in FIG. 1. That is, the nitride semiconductor structure comprises a GaN hetero-structure, e.g., a GaN/AlGaN hetero-layer 16/18. The AlGaN layer is patterned to define a plurality of active regions 372 comprising 2DEG regions of the device area 303 of the substrate. As shown in FIG. 4B, which shows an enlarged view of part of the array 301 of islands, each island 304 comprises a source electrode 320, a drain electrode 322, and gate electrode 326. The islands of the array are arranged in rows (x direction) and columns (y direction), in a repeating pattern based on a building block 302 comprising four islands 304, indicated in dashed outline in FIG. 4B.

A further enlarged view of one building block (repeating cell) 302 of the array, comprising four isolated islands 304-1, 304-2, 304-3, and 304-4, is shown schematically in FIG. 4C. The source electrodes 320 each comprise a plurality of source peninsulas 330 and the drain electrodes 322 each comprise a plurality of drain peninsulas 332. On each island, the source and drain peninsulas, 330 and 332 respectively, are interleaved, over an active region 372 of the island. A gate electrode 326 is formed on the semiconductor surface 318 and runs in the channel region 324 between the source and drain peninsulas, and form one element of the multi-island transistor. In this embodiment, all respective electrodes (source, drain and gate electrodes) of each island are separate from and electrically isolated from electrodes of neighbouring islands, in both directions of the array of islands. As illustrated schematically in FIG. 4D, the GaN hetero-structure layer comprising the layer of GaN 316 and the overlying layer of AlGaN 318 is formed on the device area of the underlying semiconductor substrate. The AlGaN layer 318 is patterned to form an active area 372 extending over each island 304-1, 304-2, 304-3, and 304-4, on which the source and drain peninsulas, 330 and 332 respectively, extend to define the channel region 324 running between the peninsulas. A gate electrode 326 is formed on each respective channel region 324.

In this matrixed structure, in each "column" of the array or matrix (except at edges of the array), each source electrode is adjacent a source electrode of a neighbouring island, and each drain electrode is adjacent a drain electrode of a neighbouring island, so as to provide isolation or inactive regions 370 between neighbouring islands in a x (row-wise) direction. Thus, as illustrated in FIG. 4C, on each island, the source electrode peninsulas 330 and drain electrode peninsulas 332 are interleaved and spaced apart on an active region 372 to form the channel region 324 therebetween, with the gate electrode 326 running between the peninsulas to form an isolated island transistor element having a gate width $w_g$. For each isolated island 304-1 to 304-4, respective contact areas (or contact pads) 340 and 342 provides for electrical connection of the source and drain electrodes 320 and 322 and the gate electrode 326 is connected to a gate contact area 346.

In each "row" of the array or matrix, at edges of islands, the edge peninsulas of the source electrodes are placed next to edge peninsulas of the neighbouring source electrodes, and edge peninsulas of the drain electrodes are placed next to edge peninsulas of the neighbouring drain electrode. This arrangement provides isolation or inactive regions 370 between the islands in a y (column-wise) direction. These inactive regions 370 extend between the islands in each of the x and y directions.

Thus, in the resulting multi-island structure, electrodes of each island of the array are electrically isolated from electrodes of neighbouring islands. Additionally, inactive regions 370 of the substrate separate active regions 372 comprising 2DEG regions of each island.

It will be apparent that the electrode arrangement on each island has a similar structure, but its orientation is related to that of an adjacent island by a particular symmetry operation (reflection or rotation about a column-wise or row-wise axis), i.e., adjacent islands have mirror symmetry relative to the direction of a y (column-wise) axis between them and each adjacent island has 180 degree rotational symmetry relative to the direction of a x (row-wise) axis between them. The building blocks are arranged like tiles, in a repeating pattern as a tiled array or wallpaper like pattern. Each building block (or "primitive cell", to use group theory notation) thus comprises 4 islands, arranged with a line group symmetry of p2 mg using IUC notation, or 22* using Orbifold notation.

The AlGaN layer of the GaN/AlGaN hetero-structure is patterned to define active regions 324 of each island 304-1, 304-2, 304-3, and 304-4, which extend beneath the interleaved source and drain peninsulas, close to the rounded ends of the source and drain peninsulas, 320 and 330 respectively. The source, drain and gate contacts, 340, 342 and 346 respectively, are arranged on portions of the source, drain and gate electrodes which extend over the inactive regions 370.

In this arrangement, each drain electrode is spaced from and adjacent to another drain electrode, and each source electrode is spaced from and adjacent to another source electrode. Preferably, the gate contacts 346 are located away from high voltage drain electrode contacts 342. Thus, as illustrated in FIGS. 4B and 4C, the gate contacts 346 are positioned in the vicinity of the source contacts 340.

The electrodes are shaped to provide sufficient contact area for conventional bond pads, which allow for electrical probing and testing of each electrode. That is, the contact areas must have a suitable minimum size, e.g. 80 μm diameter, for electrical probing. In a column-wise direction, where drain electrodes are placed next to another drain electrode, the adjacent drain electrodes 322 are shaped so as to taper and provide a promontory 341 for a drain contact area 342, and the promontories are arranged in an interlocking fashion to provide denser packing of the island electrodes. Similarly, where there are adjacent source electrodes in the column-wise direction, each source electrode 320 has a promontory 321 to provide sufficient area for the source contact 340. Drain contact areas 342 of sufficient size are arranged in the resulting spaces between the source electrodes. The promontories may vary in size and shape depending on the contact area required and the contact technology being used.

Figure 5A:
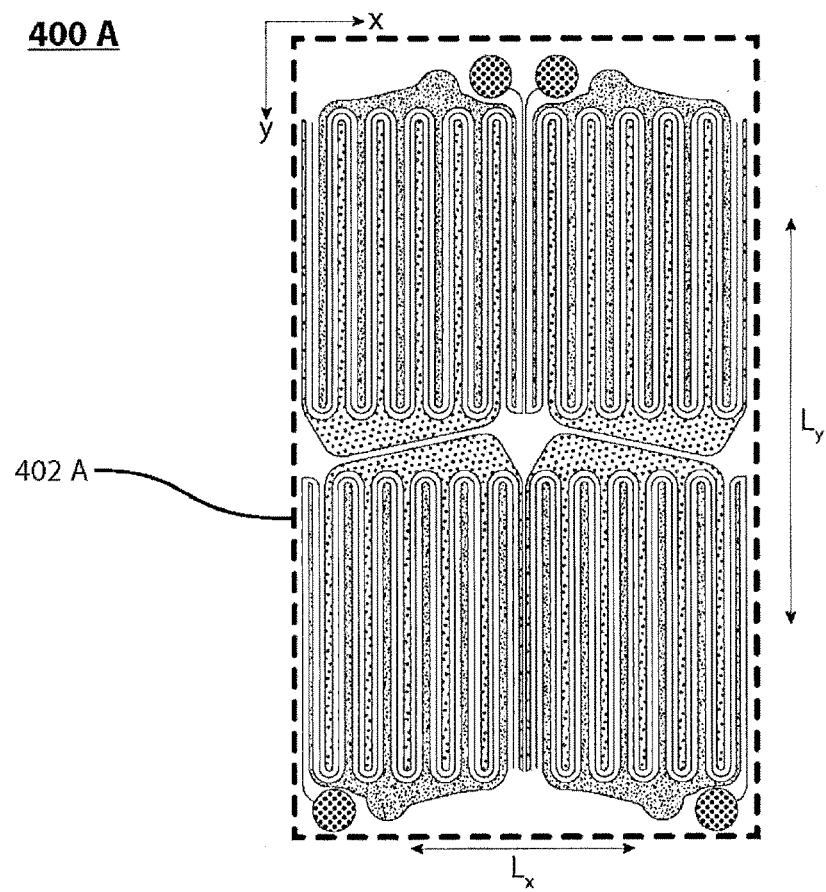
FIG. 5A illustrates schematically a plan view of part of a GaN transistor similar to that shown in FIG. 4B wherein the lengths of the building blocks of four islands in the x (row-wise) direction and y (column-wise) direction differ from those shown in FIG. 4B.
Figure 5B:
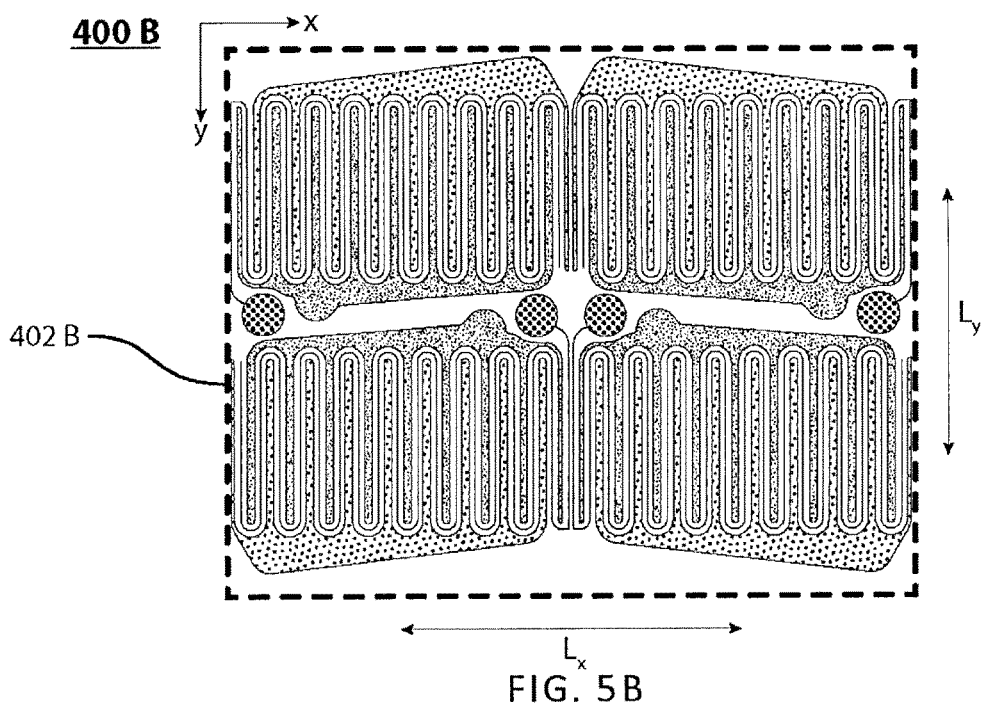
FIG. 5B illustrates schematically a plan view of part of a large area GaN transistor structure similar to that shown in FIG. 5A wherein the lengths of the building blocks of four islands in the x (row-wise) direction and y (column-wise) direction differ from those shown in FIG. 5A.

Thus, apart from the promontories for the contact areas, each building block 302 shown in FIGS. 4A to 4D has an approximately rectangular or quadrilateral shape, with similar dimensions of each island in the x and y (row and column) directions. However, these dimensions may be varied. For example, in the arrangement 400 A shown in FIG. 5A, each building block 402 A is narrower in a x (row-wise) direction than in the y (column-wise) direction, i.e., Lx<Ly. In the arrangement 400 B, shown in FIG. 5B, each building block 402 B is wider in an x (row-wise) direction. The relative dimensions of the islands and building blocks are adjusted and optimized based on various design parameters, defect density, and to meet the required specifications, e.g., current and voltage handling capabilities. One parameter determining an optimum layout is the minimum contact pad size required by available interconnect technologies, and which enable electrical probing and testing. As mentioned above, typically, currently available technology requires a minimum pad size (contact area) of about 80 μm diameter, or an 80 μm×80 μm rectangular pad. The minimum pad size is dependent on the type of interconnect, which may be wire-bonding, or a flip-chip type ball/bump, or via type interconnection, or conductive posts, for example. More recently, interconnect and test technology has become available, which provides for the pad size to be reduced to about 25 μm diameter. In future, smaller pad sizes may be feasible. Other parameters for consideration in the layout design and dimensions include the defect density, and the required $W_g$ per island.

Figure 6A:
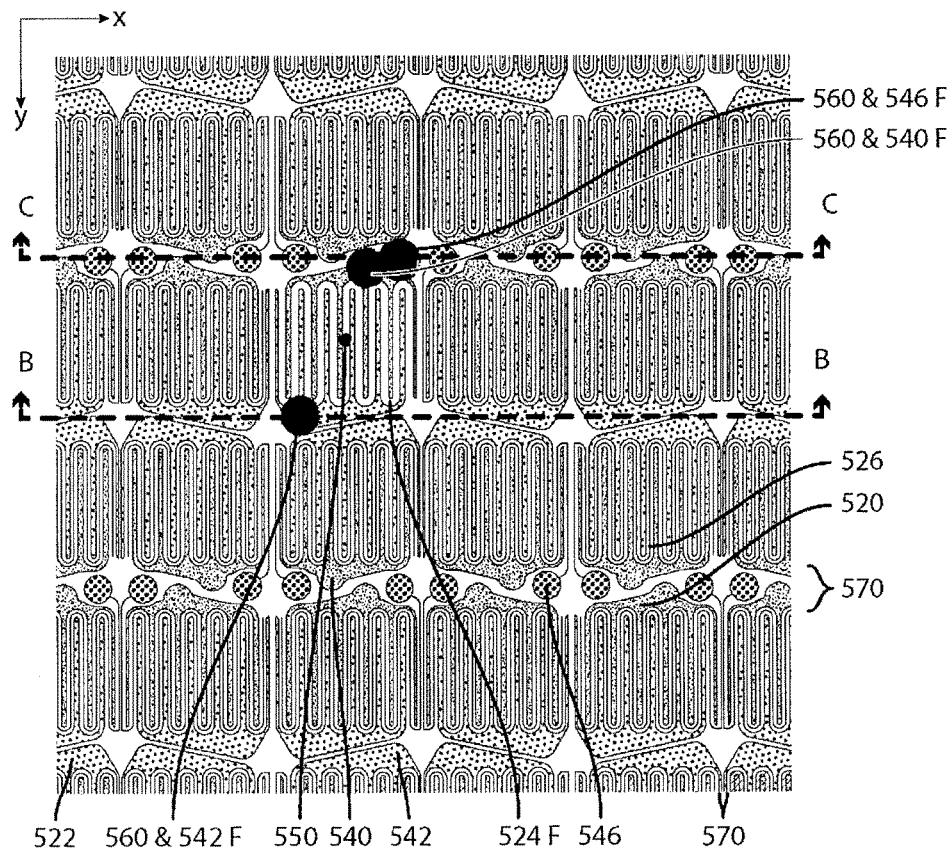
FIG. 6A shows a plan view of part of a large area GaN transistor structure similar to that shown in FIGS. 4A and 4B, illustrating fault isolation for a defective island.
Figure 6B:
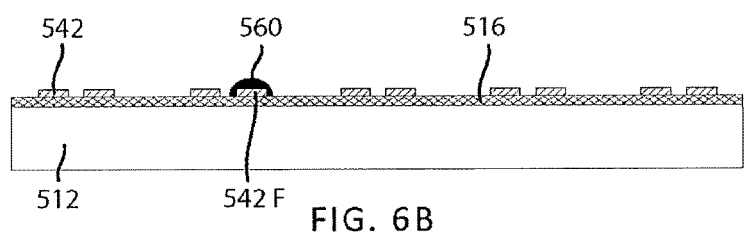
FIG. 6B shows a cross-sectional view through line B-B of the large area GaN transistor structure shown in FIG. 6A, illustrating fault isolation of a drain contact of the defective island.
Figure 6C:
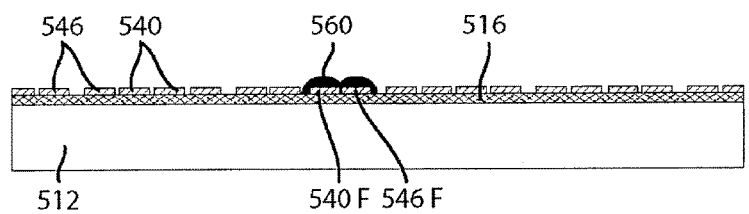
FIG. 6C shows a cross-sectional view through line C-C of the large area GaN transistor structure shown in FIG. 6A, illustrating fault isolation the source and gate contacts of the defective island.

Referring to FIGS. 6A, 6B and 6C, the advantages of isolated island topology for fault detection and isolation will now be described in more detail. FIG. 6A shows schematically part of an isolated island array 500 similar to that shown in FIG. 4B. That is, there are a plurality of islands, each having a source electrode 520, a drain electrode 522 and a gate electrode 526 running in a channel region 524 between respective peninsulas 530/532 of the interleaved source and drain electrodes 520/522. As an example, a fault 550 is shown schematically in the channel region of the defective or faulty island $I_F$, i.e., the island of row 2 and column 3 of that part of the matrix/array that is shown in FIG. 6A.

Since each island is electrically isolated, testing to locate faults may be carried out island by island, i.e., by electrically probing the source electrode, drain electrode, and gate electrode for each island in turn. If a fault is detected, e.g., fault 550 in the respective island $I_F$ shown in FIG. 6A, an insulating layer is provided on each of the contact pads 540-F, 542-F, and 546-F for the source electrode 520-F, drain electrode 522-F and gate electrode 526-F. As shown in FIG. 6B, which is a cross-section through line B-B in FIG. 6A, through the isolating row-wise regions 570 between islands, a GaN layer 516 is formed on the silicon substrate 512, and drain pads 542 are arranged row-wise in an x direction. The insulating layer 560 comprises, for example, a spot of printed insulation applied to isolate the drain contact of the faulty island $I_F$. Similarly, FIG. 6C shows a cross-section through line C-C in FIG. 6A, showing similar isolation of the source contact 540-F and gate electrode contact 546-F, using a spot of printed insulation. Subsequently, when overlying interconnect metallization layers are provided to form contacts to each other source, drain and gate contact pad 540, 542 and 546 (see FIGS. 7A, 7B and 7C), the faulty island $I_F$ will remain electrically isolated, while all good islands will be electrically connected so as to distribute current in parallel across the source electrodes and drain electrodes and to interconnect all gate electrodes to a common gate pad, thereby providing a large $W_g$ transistor.

Figure 7A:
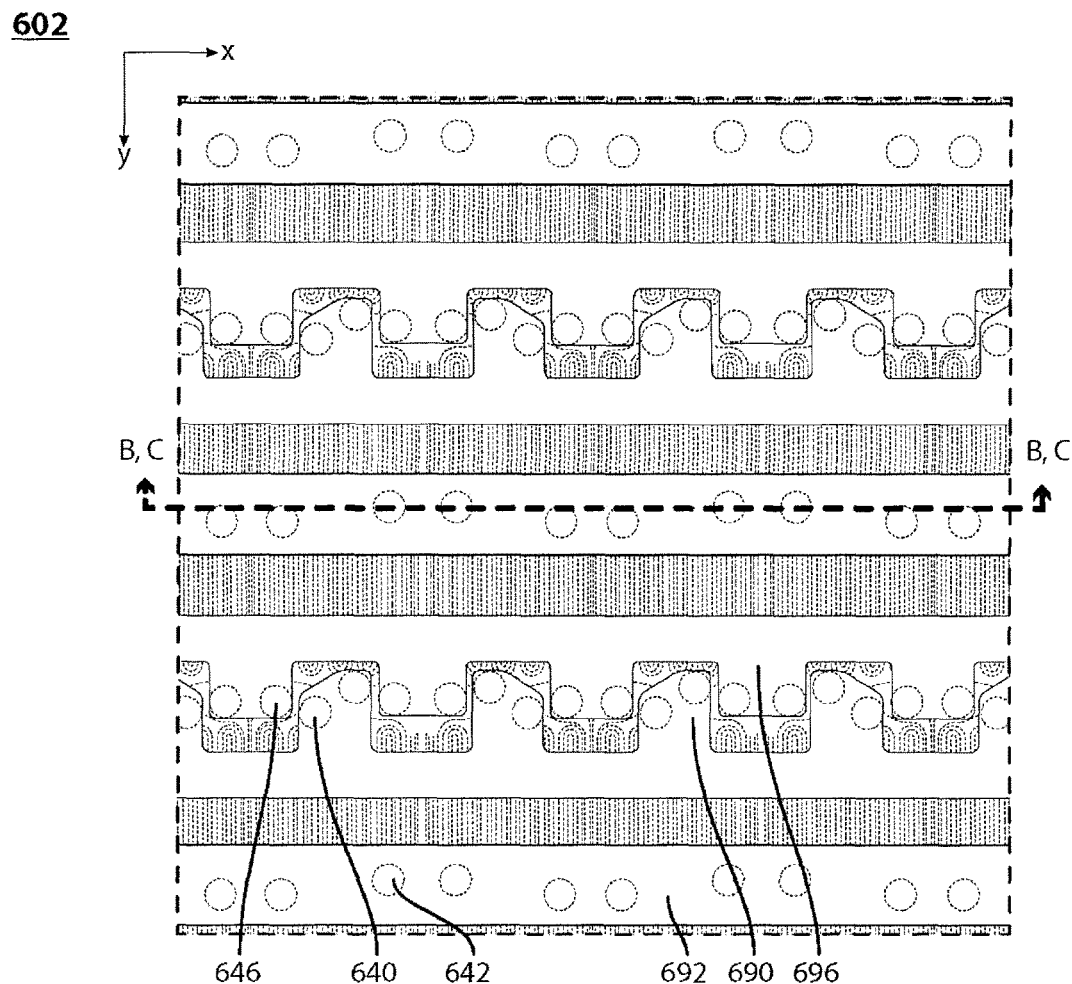
FIG. 7A shows a plan view of part of the large area GaN transistor structure according to the first embodiment, similar to that shown in FIG. 6A, after formation of an overlying metallization layer to form source straps, drain straps and gate straps interconnecting, respectively, the source electrodes, drain electrodes and gate electrodes of multiple islands according to a first embodiment.
Figure 7B:
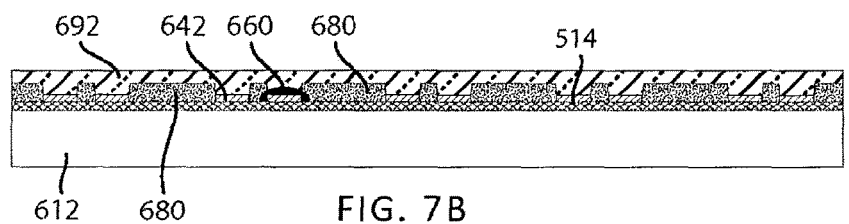
FIG. 7B shows a cross-sectional view through line B-B of the large area GaN transistor structure shown in FIG. 7A, showing a first alternative for patterning of the dielectric layers.

FIGS. 7A and 7B illustrate schematically a structure 602 of a first embodiment, comprising interconnect metallization layers 690, 692 and 696 of an interconnect structure providing respective source strap and drain strap connections to each source electrode and drain electrode for good islands, and to provide gate interconnections to gate electrodes for each good island. FIG. 7A shows a source strap 690, a drain strap 692 and a gate strap 696, which are electrically interconnected to respective underlying source contact areas 640, drain contact areas 642, and gate contact areas 646. As illustrated in cross-section in FIG. 7B, similar to FIG. 6B, the structure comprises a GaN/AlGaN heterolayer 514 provided on a silicon substrate 612, and drain contact areas 642. After electrical testing and applying a spot of printed insulation 660 to contact areas of any defective cells, an insulating layer 680, e.g., a layer of polyimide, is selectively provided on the structure as illustrated in FIG. 7B. For example, a layer of polyimide is deposited over all, and vias are opened through the polyimide layer to each source, drain, and gate contact areas (contact pads) 640, 642, and 646 respectively. The printed insulation layer 660 leaves the contacts of the defective cell electrically isolated. Then, one or more metallization layers are selectively provided to define a source electrode strap 690, a drain electrode strap 692 and a gate electrode strap 696. For example, after patterning the dielectric/insulating layer 680 to open contact vias, an interconnect layer, e.g. copper or other metallization, is selectively deposited to form a drain strap 692 interconnecting each drain pad 642. As will be apparent, metallization is also selectively deposited to define the source strap and gate strap. Selective deposition of the metallization layer or layers may be provided by any suitable known process, e.g., by patterning a mask and depositing or plating a copper layer, or by depositing a conductive metallization layer overall, and then subsequently masking and etching the metallization layer to define each source, drain and gate strap. Similarly the insulating layer of polyimide or other insulating material may be deposited overall, then masked and etched, or a mask may be provided for selective deposition of insulating material only where required. That is, although source, drain and gate electrodes of all islands of the array are isolated in both directions of the array, source, drain and gate interconnections are provided by the overlying interconnect structure, which comprises one or more dielectric (insulating) layers and metallization layers that form the source, gate and drain straps interconnecting respective source, drain and gate electrodes of a set of multiple islands, e.g., rows of islands.

Figure 7C:
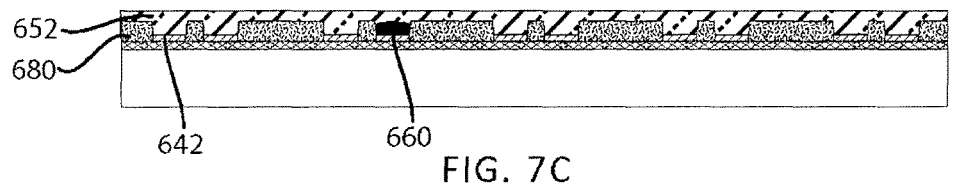
FIG. 7C shows a cross-sectional view through line C-C of the large area GaN transistor structure shown in FIG. 7A, showing another alternative for patterning of the dielectric layers.

In a variant of this embodiment, as illustrated in FIG. 7C, a passivation layer of a suitable dielectric layer 680 is deposited overall, and then selectively removed to define via contact openings to each source contact pad 640, drain contact pad 642 and gate contact pad 646. Thereafter, the islands are electrically probed and tested to identify defective islands. Insulation, such as a spot of printed insulation material 660, is applied within the via contact openings of the defective islands, to provide a spot or plug of insulation to isolate contact areas of defective islands before the overlying interconnect metallization layers 652 are fabricated.

Figure 8A:
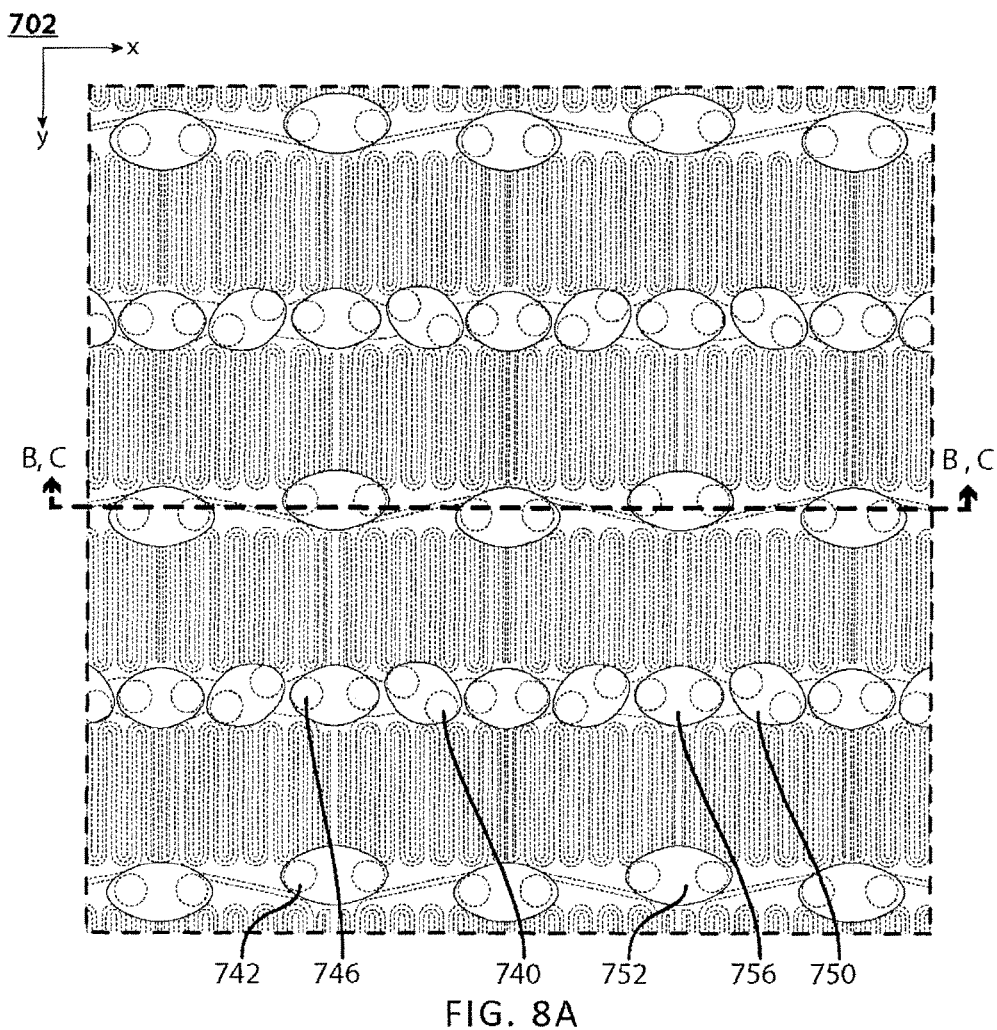
FIG. 8A shows a plan view of part of the large area GaN transistor structure of a second embodiment, having an isolated island structure similar to that shown in FIG. 6A, but differing from FIG. 7A, in that it comprises metallization to form large-area source, drain and gate contact pads interconnecting neighbouring pairs of source, drain and gate contacts.
Figure 8B:
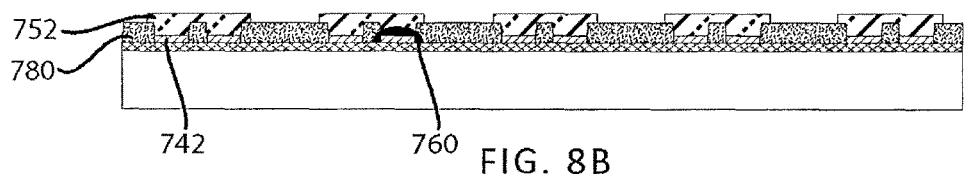
FIG. 8B shows a cross-sectional view through line B-B of the large area GaN transistor structure shown in FIG. 8A.
Figure 8C:
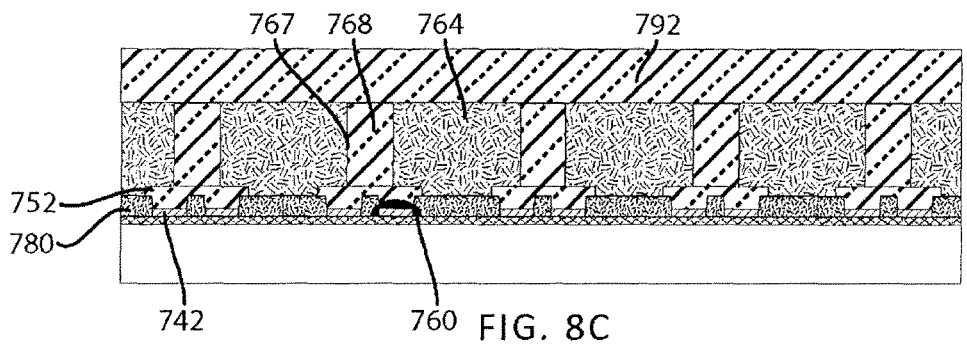
FIG. 8C shows a cross-sectional view of the structure shown in FIG. 8B after further processing steps to add metallization layers, according to the second embodiment, comprising copper conducting layers of a subsequent processing step.

FIGS. 8A, 8B and 8C shows an interconnect arrangement 702 according to another embodiment using chip (or die) embedded technology, as typically used for Printed Circuit Board (PCB) fabrication. This takes the structure from a chip scale to PCB scale fabrication process. In this embodiment, after forming the multi-island array for the transistor, including source, drain and gate electrodes for each island, an insulating layer 780 (FIG. 8B) is deposited thereon and patterned to open up contact openings to each drain, source or gate pad, i.e. each drain pad 742, source pad 740 and gate pad 746 illustrated in FIG. 8A. After testing to locate faulty islands, the faulty islands are isolated by applying printed insulation 760 (as illustrated in FIG. 8B) on respective source, drain and gate pads of the faulty island. The preceding steps are as described with reference to either FIG. 7B or 7C. Subsequently, a first metallization layer, e.g., copper is deposited to provide large area source contact pads 750 (super-pads) extending over each pair of source contact pads 740, large area drain contact pads 752 extending over each pair of drain contact pads 742, and large area gate contact pads 756 extending over each pair of gate contact pads 746.

Thus, as illustrated in FIG. 8C, the copper is deposited to provide copper drain contact pads 752 with sufficient area to contact each pair of drain pads 742. For example, if each drain pad is 80 μm diameter, the copper super-pad will be about 160 μm by 80 μm. A conventional PCB thick dielectric layer, e.g., FR4 dielectric 764, is provided thereon and patterned to define openings 767 for copper vias 768, using conventional PCB via dimensions which are about 150 μm. Copper is then deposited to form the copper vias 768. An overlying layer of copper 792, which acts as the drain strap, contacts the copper vias 768 interconnecting the individual copper vias 768 through the larger pads 752 to each pair of drain contacts 742.

In practice, for isolation of defective cells, the approach illustrated in FIG. 7C may be preferred. That is, a layer of insulating material is deposited over the wafer, and patterned to provide contact openings to all source, drain and gate contact areas. Then defective cells are isolated by providing a spot or plug of insulating material selectively in contact openings of defective cells. As will be appreciated, if, alternatively, the insulating material 760 is applied before the insulating layer 780, as illustrated in FIG. 7B, it is necessary that the insulating layer 780, e.g., a polyimide dielectric, can be selectively pattered to open contacts to each of the gate, source and drain pads, without removing the insulating material 760, e.g., printed insulation, isolating contact pads of faulty or defective islands.

In one embodiment, to facilitate integration with a standard process flow, the following process steps may be used for selective isolation of defective cells, using a single dielectric layer. After forming source, drain and gate contacts, the wafer is probed and electrical testing is performed to identify defective cells in each die, and to obtain data which defines coordinates of contact areas of source, drain, and gate contact areas to be isolated, i.e., to map good and bad cells in each die. A layer of a suitable dielectric is deposited on the wafer, e.g., a photosensitive negative-tone polyimide dielectric is spun on over the entire wafer. A standard photoresist mask based exposure is made to pattern the dielectric, i.e., expose areas where a polyimide layer is to be provided, and to leave all source, drain and gate contact pads open (unexposed). Before conventional process steps are performed to remove unexposed polyimide from all contact areas, an additional step is performed. The additional step uses an optical system that can selectively identify and expose (close) the contact pads of defective cells to be isolated. Since defective cells will differ from die to die, the dielectric layer for each die is patterned individually. The optical system may comprise a computer numerical controlled (CNC) two axis machine, capable of producing a light beam the diameter of, or marginally larger than a contact pad to be isolated. Using data from electrical testing, which identifies the location or coordinates of contact areas of faulty cells, a map is defined for each contact area or pad to be closed. The wafer is then optically scanned with the CNC machine, using the map or coordinates of defective islands, to control the light beam to selectively expose (close) contact areas of faulty or defective cells. After the CNC exposure, or "touch-up", to expose and close contact areas of defective cells, the wafer is returned to the regular process flow. The resulting polyimide dielectric layer provides source, drain and gate contact openings only to cells that tested good, and contact areas to defective cells are covered in dielectric, so that they are isolated from overlying interconnect metallization.

In a variant of the latter process, instead of using a standard mask to first define all contact areas in the polyimide layer, the CNC machine may be used to optically scan or "paint" the polyimide layer to individually pattern the polyimide layer for each die, to provide a dielectric insulating layer as required, including selectively closing contact areas/pads of defective cells, while leaving source, drain and gate contact areas to good cells open.

Figure 9A:
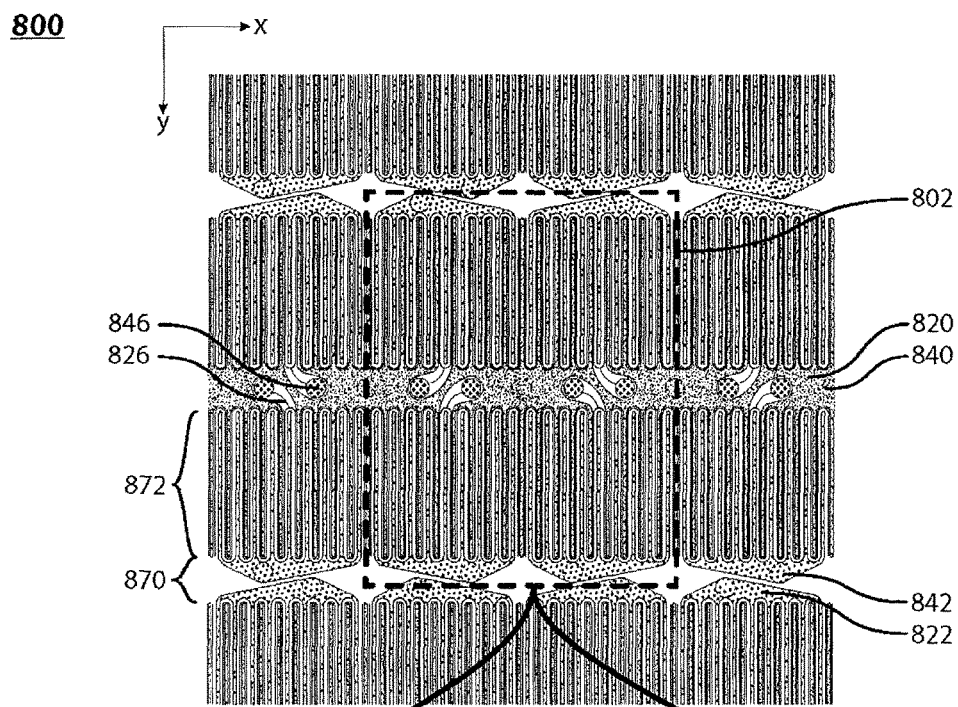
FIG. 9A illustrates schematically a plan view of a part of a large area GaN transistor structure according to another embodiment, comprising a multi-island array (matrix) of a plurality of electrically isolated islands, each island comprising a shared common source electrode, a drain electrode, and a gate electrode, as well as respective source, drain and gate contact pads, with a dashed outline indicating one building block of four islands.
Figure 9B:
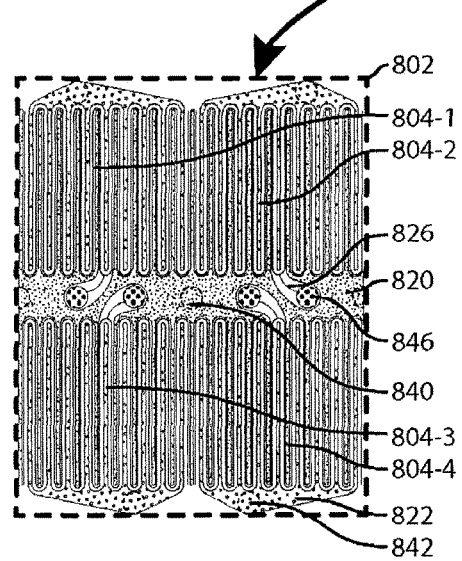
FIG. 9B illustrates schematically an enlarged plan view of the building block of four electrically isolated islands shown in FIG. 9A.
Figure 9C:
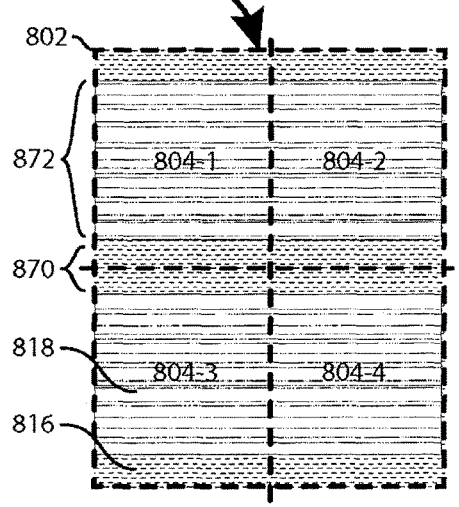
FIG. 9C illustrates schematically a view of active 2DEG regions of the underlying GaN semiconductor layer of the structure shown in FIG. 9B.

As shown in FIGS. 9A, 9B and 9C, a GaN power transistor comprising an isolated island electrode structure 800 of yet another embodiment comprises a plurality of isolated islands similar to those shown in the preceding sets of FIGS. 4 to 8. Thus, as illustrated in FIG. 9A, the structure 800 comprises a building block 802, with active areas 872, inactive regions 870, source electrodes 820, drain electrodes 822, gate electrodes 826, source contact pads 840, drain contact pads 842, and gate contact pads 846. The arrangement shown in FIG. 9A is similar to that shown in the above described embodiments, in that the building block 802 (or primitive cell) of the repeating pattern of the matrix comprises 4 islands arranged with the same p2 mg (IUC notation) or 22* (Orbifold notation) symmetry as the arrangement previously described. However, in this embodiment, the gate connections are centered row-wise between each adjacent island. One building block 802, comprising four islands 804-1, 804-2, 804-3 and 804-4, is shown enlarged in FIG. 8B. This center-fed gate arrangement (i.e., a "forked gate" or "bi-furcated centered gate" arrangement), halves the gate connection length of each gate electrode. This structure has a common/shared source connection. Also, as illustrated, there is a shared source peninsula along the y-axis in the column-wise direction. In this structure, unlike the previously described embodiments, the active 2DEG area 872 comprising the GaN/AlGaN hetero-junction structure extends in the y direction between each island across the row-wise direction, as shown in FIG. 9C. However, an inactive region 870 comprising only the GaN layer 816 extends in the x direction between each row of islands. The structure of this embodiment provides an improvement in density and efficiency, i.e., the areas 872 extending in the y direction between islands along each row are also active 2DEG areas.

To isolate a defective island, it is necessary only to disconnect/isolate the drain and gate of the faulty/defective island. Since the source of the faulty island is not disconnected, there is a penalty in having a common source connection, in that the remaining source connection introduces some stray capacitance. Nevertheless, this penalty is small when compared to the total capacitance of the large size of the device. FIG. 9C illustrates how the active areas defined by the GaN/AlGaN hetero-structure layers, comprising GaN layer 816 and overlying AlGaN layer 818, are patterned for this embodiment. That is, within each building block, and between building blocks, the four islands are isolated by regions 870 extending in the x direction between rows of islands, but the active area 872 extends in the y direction between columns of islands. Source, drain and gate contacts are provided to enable each island to be independently probed, tested and isolated, as appropriate.

While each island may be individually tested electrically to locate faults, another more efficient approach to testing is to connect and test each row of islands as a whole, to determine if the row is good or bad. For example, it may be expected that only 2% to 3% of islands will have a fault, whereas most islands and rows of islands will be good. When a bad row is detected, individual islands, or sets of islands in that row are then tested to locate any island(s) having a fault. Faulty islands can thus be located, mapped, and/or isolated more quickly.

In embodiments described above, faulty islands may be isolated by placing insulation, as appropriate, on one or more of the source, drain and/or gate pads of defective islands, i.e., to block electrical connections when the metal interconnect layers are subsequently formed. However, another approach is to proceed with making electrical contacts to all source, drain and gate pads and then selectively connecting only good islands by custom patterning of the interconnect metallization, i.e., the next level of interconnect, by patterning the source, drain, and gate straps to connect to only good islands, based on a map of good and bad islands generated by testing.

Any known method of selective formation of one or more metallization layers may be used. A direct write e-beam method may be used to define interconnect metal to connect all good islands.

Figures 10A, 10B, 10C:
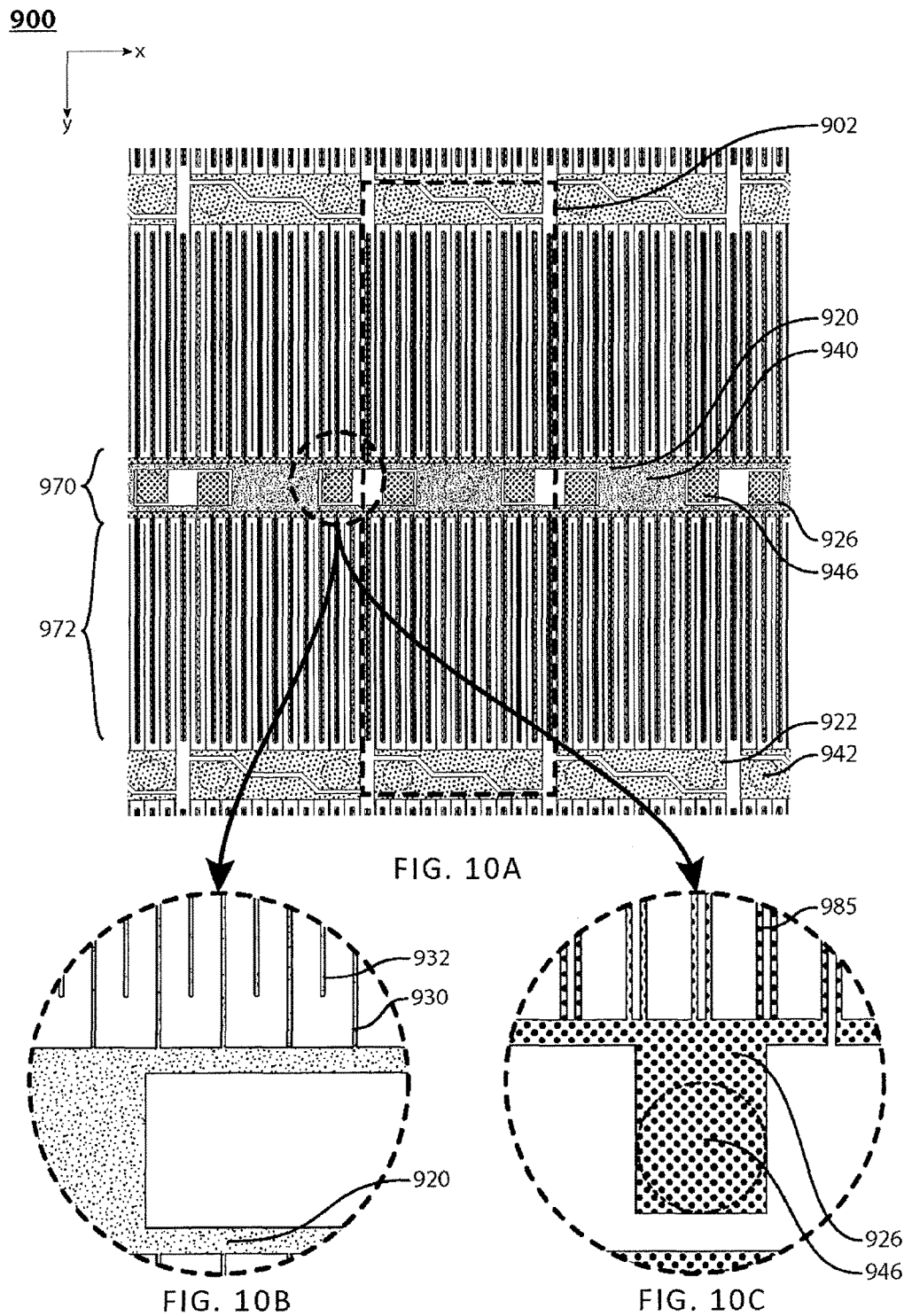
FIG. 10A illustrates schematically a plan view of a part of a large area GaN transistor structure according to yet another embodiment, comprising a multi-island array (matrix) of a plurality of electrically isolated islands, each island comprising a shared common source electrode, a drain electrode, and a gate electrode, and respective source, drain and gate contact pads, with a dashed outline indicating one building block of two islands.
FIGS. 10B and 10C show, respectively, enlarged views of parts of FIG. 10A, comprising a first metallization layer comprising the source electrode; and, a second metallization layer comprising the gate electrode.
Figures 10D, 10E:
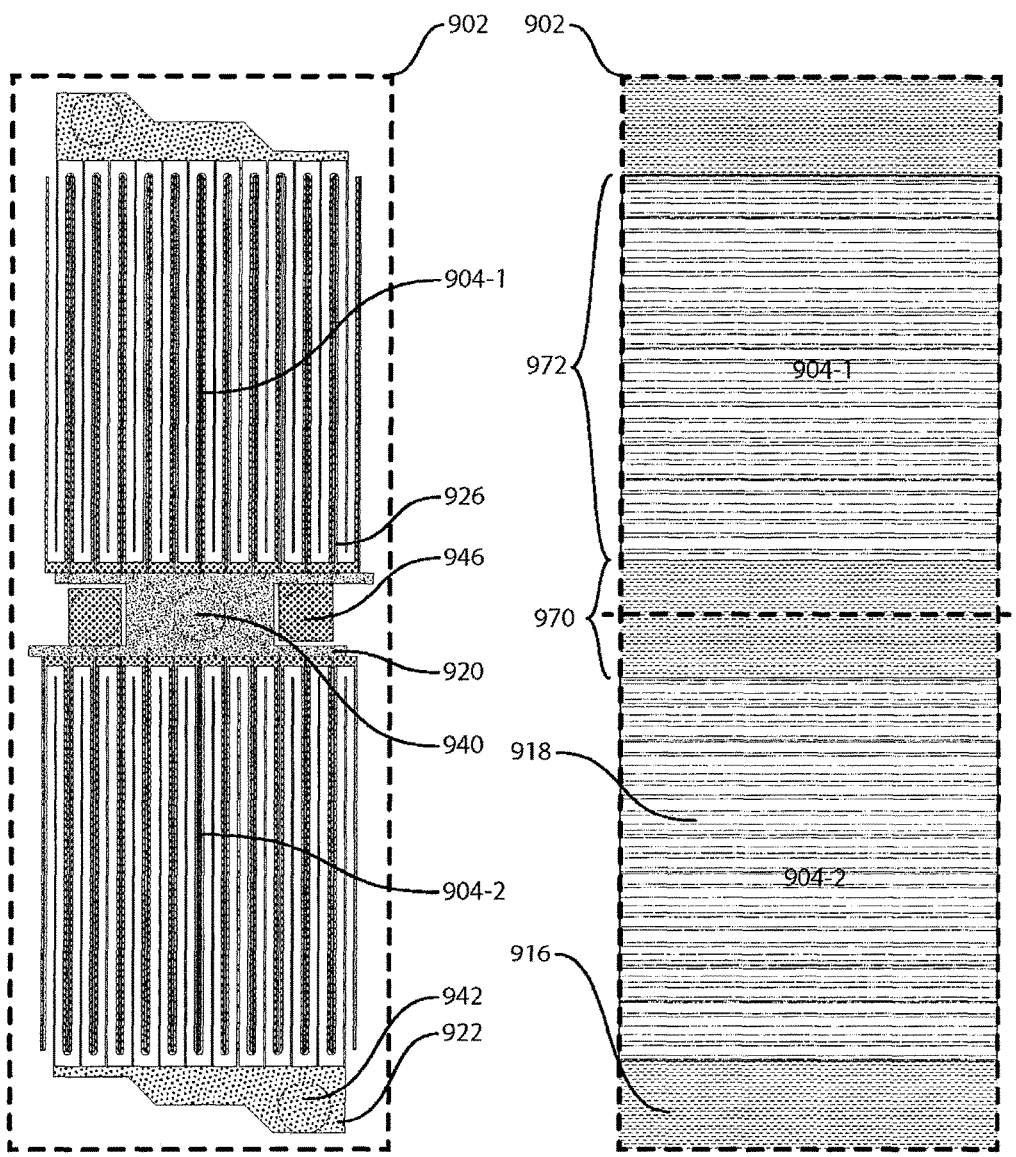
FIG. 10D illustrates schematically an enlarged plan view of the building block of two electrically isolated islands shown in FIG. 10A.
FIG. 10E illustrates schematically a view of active 2DEG regions of the underlying GaN semiconductor layer of the structure shown in FIG. 10D.

Yet another embodiment is shown in Figures to 10A to 10E. As illustrated in FIG. 10A, each island has a castellated source electrode 920 and drain electrode 922, with a gate electrode 926 running between interleaved source and drain peninsulas 930 and 932 respectively, over channel regions, similar to those shown in FIG. 9. Neighboring pairs of islands share a common source electrode 920. This structure illustrates one example of how multilevel metal is used for the electrode metallization to provide for an optimized gate layout and lower gate resistance. One level of metallization defines each source electrode 920, comprising source peninsulas 930, as well as each drain electrode 922, comprising drain peninsulas 932. Source contact areas 940 are provided on the source electrode 920 and drain contact areas 942 are provided on drain electrodes 922. Parts of these are illustrated in more detail in the enlarged schematic shown in FIG. 10B. As illustrated in the enlarged schematic in FIG. 10C, each gate electrode 926, gate pad 946 and gate field plate 985 is provided by another metallization layer. By using two or more metallization layers source and gate metal layers can be stacked one over the other, i.e., separated by an appropriate insulating layer. For example, as shown, part of the source electrode runs over part of the gate 926 that extends to the gate contact 946. FIG. 10D shows a view of one building block of the array, which comprises two islands 904-1 and 904-2. As described for other embodiments, this building block can be arranged in a repeating pattern to create a larger array. FIG. 10E shows schematically the active areas 972 comprising 2DEG regions, and isolation regions (inactive regions) 970 between rows of islands, which are patterned similarly to those shown in FIG. 9C.

In summary, embodiments of the invention are described that provide a large area, large gate width GaN power transistor based on an isolated island topology, which facilitates testing and fault isolation. As will be appreciated, a similar isolated island topology is also applicable to GaN diodes.

As described above, GaN power transistor structures according to specific embodiments of the invention are described, where the GaN semiconductor layer comprises a GaN/AlGaN hetero-structure layer to provide a 2DEG channel region, formed on a silicon carbide or silicon substrate. Although these structures are described, by way of example, as normally-on nitride semiconductor transistors, the isolated island structure may also be used for normally-off nitride semiconductor transistors.

Depending on the contact structure, i.e., whether, for example, ball/bump or via contact technology is used, the substrate may be conductive or not conductive, and may comprise silicon carbide, or silicon, or other suitable material. A buffer layer may be provided on the substrate if required, to enable formation of epitaxial layers to form a nitride semiconductor hetero-junction structure, such as the GaN/AlGaN hetero-layer described above. The epitaxial layers are patterned by a suitable known process to define an active region comprising a 2DEG region of the device structure for each island.

The structures described above allow for a novel testing and fault isolation methodology, i.e., method for testing/fabricating a device structure comprising the steps of: testing in sequence each island; identifying and mapping defective islands; selectively interconnecting good islands and isolating bad islands. The testing sequence may involve testing each island individually. Alternatively, sets of islands may be tested, e.g., an entire row of islands. Then, faulty sets may be further tested in subsets of islands or individual islands to identify faulty islands.

Fabrication and testing sequences may be implemented in different ways. For example, testing may be done after passivation and forming electrical contacts for each island, in the form of contact pads of sufficient size to allow for electrical probing and testing. Then, after testing, the overlying interconnect structure would be completed in a different facility. Alternatively, if possible, electrical testing may be done during wafer fabrication, followed by completion of the overlying interconnect structure in the wafer fabrication facility.

Figure 11:
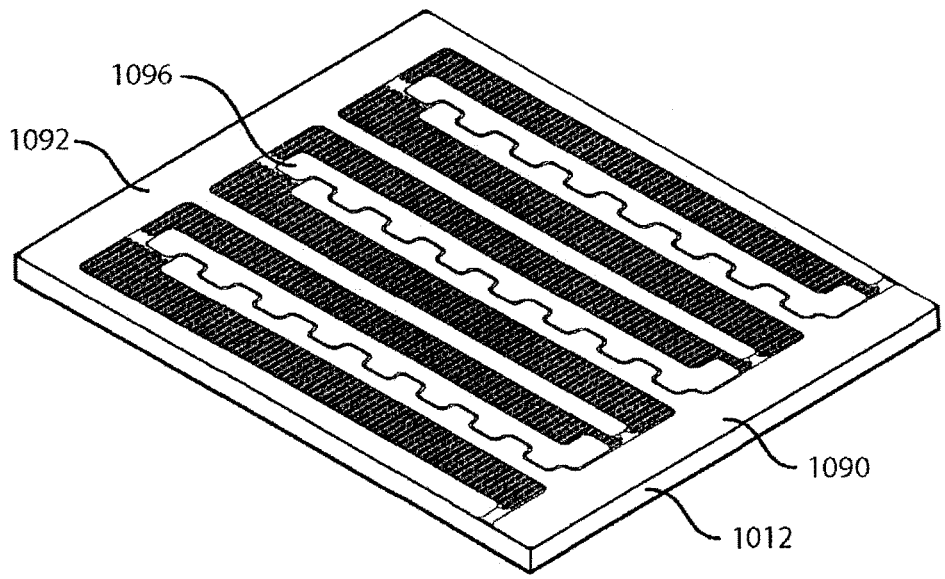
FIG. 11 shows a schematic perspective view of a chip comprising a GaN HEMT according to an embodiment of the present invention.

A chip 1000 comprising a GaN high electron mobility transistor (GaN HEMT) according to an embodiment of the invention is shown in FIG. 11. It comprises a substrate 1012, such as a silicon substrate, on which a GaN semiconductor layer is formed, i.e., a GaN/AlGaN hetero-structure, similar to that described above, which is patterned to define an array of a plurality of island regions. Then source, drain, and gate electrodes are defined as illustrated in FIG. 9 to form an array of isolated islands, i.e., 4×4 building blocks. Then metallization layers are patterned to define a source strap 1090, a drain strap 1092 and gate straps 1096.

Figure 12:
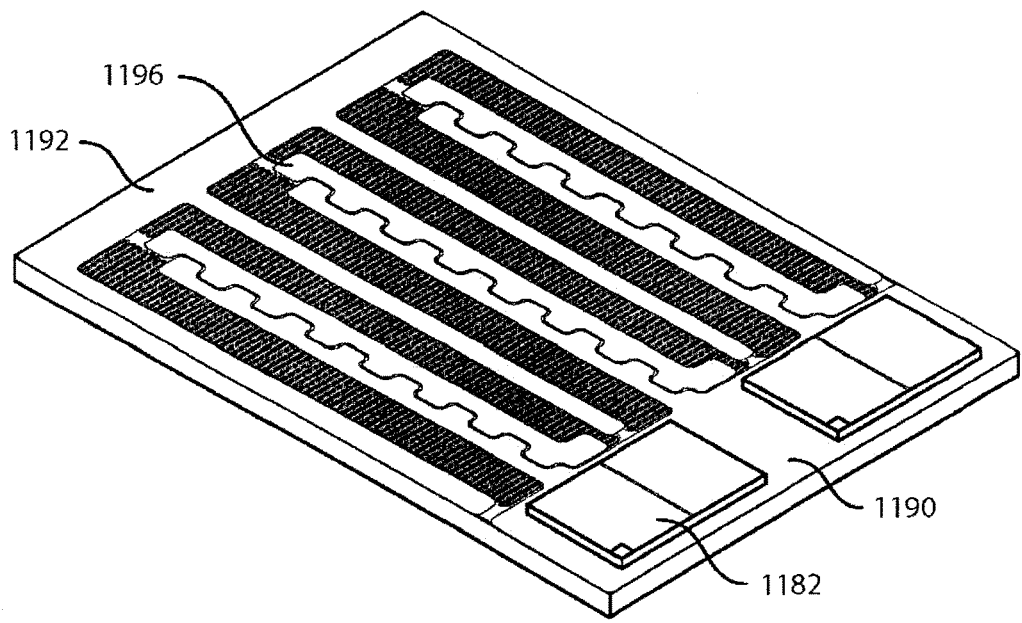
FIG. 12 shows a schematic perspective view of a chip comprising a cascode arrangement of a GaN HEMT according to an embodiment of the present invention and a pair of MOSFET driver chips mounted on the same substrate.

FIG. 12 shows a hybrid device/system/assembly 1100 according to yet another embodiment, comprising: a silicon substrate, a large area, normally-on, GaN isolated island topology transistor formed on a first area of the substrate, which is similar to that shown in FIG. 11, comprising metallization layers patterned to define a source strap 1190, a drain strap 1192 and gate straps 1196, and a pair of MOSFET driver circuits 1182 mounted on an adjacent area of the substrate so that the MOSFET drivers are directly interconnected to the GaN transistor in cascode configuration. This assembly thus provides a silicon-on-GaN-on-silicon hybrid structure. In some alternative embodiments, not illustrated, 3 or 4 large $W_g$ transistors may be provided on one substrate.

Thus, nitride semiconductor device structures, devices and systems are provided based on an isolated island topology. In this arrangement each island can be individually electrically tested independently of its neighbours. Thus, a map of good islands and defective islands across the entire area of the device or wafer can be generated. Furthermore, because each island of the array is isolated, when good islands are interconnected to form a multi-island device, defective islands are not connected and thus isolated. For example, in a large area transistor, in each defective island, each of the source, drain and gate electrodes can be isolated with minimal disruption to connections to source, drain and gate electrodes of neighbouring good islands. Removal of all connection elements for an island, i.e., source, drain and gate connections, may be advantageous to reduce any residual capacitances, electrical shorts, or other issues.

As will be apparent, this isolated island structure is also applicable to multi-island diodes using a similar multi-island topology. This technology is particularly applicable for increasing yield when fabricating large area devices on substrates with higher defect densities per unit area. For example, the test methodology and interconnect scheme is particularly applicable to nitride semiconductors, such as those comprising a GaN hetero-structure formed on a lower cost silicon substrate.

A multi-island device structure for GaN power transistors or diodes is provided that facilitates electrical testing of each individual island, and identification and mapping of good and bad (defective) islands of the array.

Following testing, and identification of good and bad (defective) islands, electrical connections between islands of the array are selectively provided with isolation of defective islands. For example, bad islands, which are defective or fail to meet electrical specifications, may be isolated after testing by providing a dielectric insulating coating to one or more of the gate, source, and/or drain contact (test) pads of the defective island. Alternatively, a dielectric insulating layer may be provided over the entire array, and then contact openings selectively opened to source/drain and gate electrodes of all good islands, as required, while defective islands are isolated by the insulating layer over their contacts.

In summary, isolation between islands in one or both directions may be provided by appropriate layout and placement of the source, drain and gate electrodes of each island, and/or by appropriate patterning of active 2DEG regions of the array of islands over the device area. Thus, in embodiments described herein, an active region requires a source electrode or source peninsula suitably spaced from a drain electrode or drain peninsula, a gate electrode in between, and an underlying GaN/AlGaN 2DEG region (i.e., S-G-D on 2DEG).

If the GaN/AlGaN hetero-layer is not present in the channel region between adjacent source and drain regions, or between neighbouring islands, then the region is not active and will provide electrical isolation between islands, without any further isolation means being required.

If there is a 2DEG region between two S-S or two D-D regions and no gate, then those two regions would be electrically connected, in fact shorted together by the 2DEG region. The gate is present to turn the 2DEG channel on or off. In some embodiments, where neighbouring islands share a common source, a gate is not needed in the region between the islands.

In some embodiments, contacts may be arranged to facilitate simultaneous testing of pairs or groups of neighbouring islands, and then, if a pair or group fails a group test, individual islands in this group can be tested separately to isolate one or more defective islands.

Advantageously, identification and mapping of defective islands in a large area semiconductor device, perhaps a 10 mm by 10 mm device, with a large array of island electrodes, enables each semiconductor device to be binned based on specifications such as aggregate gate width Wg or other parameters. Thus, the method provides the possibility of obtaining close to 100% yield of devices that are binned based on different specifications.

This testing and fault isolation methodology allows for semiconductor devices to be produced on large dies, while facilitating practical approaches to testing for defect detection and mapping of large dies, with significantly reduced test time. It then becomes feasible to fabricate large area devices with much higher yield.

This approach to fault detection in large area dies also makes it practically feasible to consider hybrid integration of the GaN devices with a MOSFET (Metal Oxide Semiconductor Field Effect Transistor) on a common substrate. As an example, for GaN power devices such as switching transistors, this allows for the GaN device to be fabricated on a large area die, such as a 5 mm×7 mm die, which comprises a 5 mm×5 mm GaN transistor and an adjacent die area to which a driver MOSFET device is mounted and is directly electrically connected in cascode configuration, so as to provide a normally-on device. For example, the driver MOSFET may be provided with a back side/substrate drain contact, which directly contacts the source connection of the GaN transistor. This provides a silicon-on-GaN-on-silicon device structure with a very low inductance between the GaN transistor and the driver MOSFET.

Device structures according to other embodiments (not illustrated) may comprise large area diodes. For example, a nitride semiconductor diode comprising: a substrate having a nitride semiconductor layer defining active regions of a device area on the substrate, said active regions comprising 2DEG regions. An array of islands is defined on the nitride semiconductor layer, the array of islands extending in first and second directions over the device area. Each island has an anode island electrode and a cathode island electrode formed on an active region of the island, spaced apart over the active region of the island to define a channel region therebetween, with a respective contact area on each electrode. The anode and cathode island electrodes of each island of the array of islands are arranged so that each island is electrically isolated from neighbouring islands in at least one of said first and second directions. An anode interconnection interconnects the anode island electrodes in parallel and a cathode interconnection interconnects the cathode island electrodes in parallel, and the anode and cathode interconnections are configured to selectively connect good islands and to provide electrical isolation of defective islands.

INDUSTRIAL APPLICABILITY

The isolated island topology for GaN power transistors and diodes disclosed herein facilitates testing for fault detection and mapping, and subsequently enables selective interconnection of source, drain and gate electrodes of each island of the array of islands, with electrical isolation of defective islands. This topology is also more generally applicable to power transistors and diodes using nitride semiconductor technologies and for both normally-on and normally-off transistors.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A device structure for a nitride semiconductor transistor comprising:
   a substrate having a nitride semiconductor layer formed on a device area of the substrate, the nitride semiconductor layer defining a plurality of active regions for an array of islands of a multi-island transistor, the array of islands extending in first and second directions over the device area,
   each of said active regions comprising a two dimensional electron gas (2DEG) region isolated from adjacent active regions by an intervening inactive region of the device area;
   each island having a source electrode, a drain electrode and a gate electrode formed on a respective active region of the island, each source electrode having a plurality of source peninsulas, each drain electrode having a plurality of drain peninsulas, the source and drain peninsulas being interleaved and spaced apart over the active region of the island to define a channel region therebetween, the gate electrode being formed on the nitride semiconductor layer over the channel region and running between the source and drain peninsulas across the island;
   each source electrode having a source contact area, each drain electrode having a drain contact area and each gate electrode having a gate contact area; and
   the source, drain and gate electrodes of each island of the array of islands having an arrangement wherein each island is electrically isolated from the source, drain and gate electrodes of neighbouring islands in at least one of said first and second directions, and
   wherein the source, drain and gate contact areas of each island provide for electrical probing and testing of individual islands for identification of defective islands and for selective isolation of a defective island from other islands of the array.

2. The device structure of claim 1 wherein the source, drain and gate electrode contact areas of individual islands each comprise a contact pad having at least a minimum size of at least 25 μm diameter required for electrical probing and testing for identification of defective islands.

3. The device structure of claim 2 wherein: the array of islands comprises an n×m matrix of n rows and m columns of islands.

4. The device structure of claim 3 wherein, for i=1 to n, the source contact areas and gate contact areas of the ith and i−1th rows of islands are arranged in rows, positioned over inactive regions of the device area between the i−1th and ith rows of islands; and drain contact areas of the ith and i+1th rows of islands are arranged in rows, positioned over inactive regions of the device area between the ith and i+1th rows of islands.

5. The device structure of claim 3 wherein the transistor further comprises an overlying interconnect structure comprising at least one dielectric layer and at least one metallization layer providing:
   a source interconnection interconnecting in parallel the source electrodes of sets of multiple islands;
   a drain interconnection interconnecting in parallel the drain electrodes of sets of multiple islands; and
   a gate interconnection interconnecting the gate electrodes of multiple islands to form a common gate.

6. The device structure of claim 5 wherein said source, drain and gate interconnections are provided selectively to respective source, drain and gate electrodes of islands, excluding defective islands, to provide electrical isolation of defective islands.

7. The device structure of claim 2, comprising defective islands, and further comprising a layer of electrically insulating material that is patterned to isolate at least one of the gate contact, source contact and drain contact of each defective island thereby providing electrical isolation of the defective islands before fabrication of an overlying interconnect structure for respective gate, source and drain interconnections.

8. The device structure of claim 1 wherein the array of islands comprises a matrix of rows and columns of islands, the 2DEG region of each island is isolated from the 2DEG region of each neighbouring island by inactive regions of the substrate extending in the first and second directions between rows and columns of islands, and in the first direction, except at edges of the array, each source electrode is positioned adjacent to a source electrode of a neighbouring island, and each drain electrode is adjacent to a drain electrode of a neighbouring island, for isolation between neighbouring islands in the first direction;

in the second direction, except at edges of the array, at least some source electrodes are positioned adjacent a source electrode of a neighbouring island, and at least some drain electrodes are positioned adjacent a drain electrode, for isolation between sets of neighbouring islands in the second direction; and wherein the contact areas of each source electrode, each drain electrode and each gate electrode are located over the inactive region of the substrate extending between islands in the first direction.

9. The device structure of claim 8 wherein, in the second direction, except at edges of the array, each source electrode is positioned adjacent a source electrode of a neighbouring island, and each drain electrode is positioned adjacent a drain electrode for isolation between each neighbouring island in the second direction.

10. The device structure of claim 8 wherein, in the second direction, except at edges of the array, for a set of islands, a side of at least one source electrode is positioned adjacent a source electrode of a neighbouring island, and/or a side of at least one drain electrode is positioned adjacent a drain electrode for isolation between sets of neighbouring islands in the second direction.

11. The device structure of claim 8 wherein for each group of four islands, the source and drain electrodes are arranged to provide said isolation between each row of islands.

12. The device structure of claim 1, wherein the array of islands comprises a matrix of rows and columns of islands and wherein in the first direction, the 2DEG region extends between neighbouring pairs of islands of a row, and in the second direction, the 2DEG region of each island is isolated from the 2DEG region of neighbouring islands of a column by inactive regions of the substrate extending between rows of islands;

in the first direction, except at edges of the array, each source electrode is positioned adjacent to a source electrode of a neighbouring island, and each drain electrode is adjacent to a drain electrode of a neighbouring island;

in the second direction, except at edges of the array, at least some source electrodes are positioned adjacent a source electrode of a neighbouring island, and at least some drain electrodes are positioned adjacent a drain electrode of a neighbouring island; and wherein contact areas of each source electrode, each drain electrode and each gate electrode are located over the inactive region of the substrate between rows of islands.

13. The device structure of claim 12 wherein, the the rows and columns of islands are arranged as a repeating pattern of a group of four islands, wherein the source and drain electrodes are arranged to provide isolation between at least each row of islands.

14. The device structure of claim 13 wherein source electrodes of neighbouring cells in the first and second directions are coupled to form a common source electrode for each neighbouring pair of rows of islands.

15. The device structure of claim 14 wherein the source and drain electrodes are further arranged to provide an active region between each column of islands.

16. The device of claim 15 wherein source electrodes of adjacent islands in a row direction are interconnected to form a common source across at least part of the row.

17. The device structure of claim 14 wherein said contact areas to the respective source electrodes and drain electrodes are provided on promontories of each respective source and drain electrode, said promontories extending over the inactive region.

18. The device structure of claim 8 wherein said contact areas to the respective source electrodes and drain electrodes are provided on promontories of each respective source and drain electrode, said promontories being tapered and extending over the inactive region between rows of islands.

19. The device structure of claim 14 wherein, for a normally-on device, for each island, the contact area of the gate electrode is arranged over the inactive region in the vicinity of the source contact of the respective island.

20. The device structure of claim 8 comprising a centre-fed gate arrangement wherein respective gate contacts of each island pair in a first direction are centered over the inactive region between each island pair and a gate connection connecting a centre region of each island gate electrode to its respective gate contact pad.

21. The device of claim 8 wherein the array comprises a plurality of islands arranged as a repeating pattern of a building block of four islands.

22. The device of claim 8 wherein the array comprises a plurality of islands arranged as a repeating pattern of a building block of four islands, the four islands of the building block being arranged in a pattern having p2 mg symmetry.

23. The device of claim 5 wherein the gate interconnection comprises one or more gate straps extending in the first direction and interconnecting gate contacts of adjacent islands; the source interconnection comprises one or more source straps extending in the first direction and interconnecting source electrodes of adjacent islands; and the drain island interconnection comprises one or more drain straps extending in the first direction and interconnecting source electrodes of adjacent islands.

24. The device of claim 5 wherein the source, drain and gate interconnections comprise a metallization layer defining source super pads interconnecting each neighbouring pair of source contact areas and drain super pads interconnecting each neighbouring pair of drain contact areas, gate super pads interconnecting each neighbouring pair of gate contact areas, and a metallization structure formed thereon comprising at least one insulating layer isolating source super pads and drain super pads and gate super pads from each other, an overlying conductive layer defining source, drain and gate straps, and conductive vias extending through the isolation layer to respective source, drain and gate super pads.

25. A method for testing and fabrication of a device structure for a transistor, comprising the steps of: providing the device structure of claim 1, probing and electrically testing islands of the array, identifying and/or mapping defective islands; and selectively providing source, drain and gate electrical connections to islands other than said defective islands, thereby electrically isolating defective islands of the transistor.

26. A device structure for a nitride semiconductor diode comprising:

a substrate having a nitride semiconductor layer formed on a device area of the substrate and defining a plurality of active regions for an array of islands of a multi-island diode, the array of islands extending in first and second directions over the device area, each of said active regions comprising a two dimensional electron gas (2DEG) region isolated from adjacent active regions by an intervening inactive region of the device area;

each island having an anode electrode and a cathode electrode formed on a respective active region of the island, each anode electrode having a plurality of anode peninsulas, each cathode electrode having a plurality of cathode peninsulas, the anode and cathode being interleaved and spaced apart over the active region of the island to define a channel region therebetween;

the anode and cathode electrodes of each island each having, respectively, an anode contact area and a cathode contact area; and the anode and cathode electrodes of each island of the array of islands having an arrangement wherein at least one electrode of each island is electrically isolated from electrodes of neighbouring islands in at least one of said first and second directions, and wherein the anode and cathode contact areas of each island provide for electrical probing and testing of individual islands for identification of defective islands and for selective isolation of a defective island from other islands of the array.

27. The device structure of claim 26, further comprising:
an overlying isolation layer providing contact openings only to contact areas of non-defective islands and isolating contact areas of defective islands;
an anode interconnection interconnecting the anode island electrodes in parallel;
a cathode interconnection interconnecting the cathode island electrodes in parallel; and
said anode and cathode interconnections thereby selectively connecting non-defective islands and providing electrical isolation of defective islands of the multi-island diode.

28. The device structure of claim 5, wherein said overlying interconnect structure comprises electrical connections formed on said respective contact areas of the source, drain and gate electrodes of non-defective islands, comprising any one of:
a) ball/bump interconnections;
b) via type interconnections;
c) conductive posts; and
d) a combination thereof.

29. The device structure of claim 14 comprising a centre-fed gate arrangement wherein respective gate contacts of each island pair in a first direction are centered over the inactive region between each island pair and a gate connection connecting a centre region of each island gate electrode to its respective gate contact pad.

* * * * *

UNITED STATES PATENT AND TRADEMARK OFFICE
CERTIFICATE OF CORRECTION

PATENT NO. : 9,818,857 B2  
APPLICATION NO. : 15/032824  
DATED : November 14, 2017  
INVENTOR(S) : Klowak et al.

Page 1 of 1

It is certified that error appears in the above-identified patent and that said Letters Patent is hereby corrected as shown below:

In the Specification

Column 6, Line 8: Replace "source" with "drain".

In the Claims

Column 24, Line 35, cancel the text beginning with "23. The device" to and ending with "adjacent islands." in Column 24, Line 43 and insert the following claim:
--23. The device of claim 5 wherein the gate interconnection comprises one or more gate straps extending in the first direction and interconnecting gate contacts of adjacent islands; the source interconnection comprises one or more source straps extending in the first direction and interconnecting source electrodes of adjacent islands; and the drain island interconnection comprises one or more drain straps extending in the first direction and interconnecting drain electrodes of adjacent islands.--.

Signed and Sealed this  
Nineteenth Day of March, 2019

Andrei Iancu  
*Director of the United States Patent and Trademark Office*